(12) United States Patent
Takahashi et al.

(10) Patent No.: US 8,181,774 B2
(45) Date of Patent: May 22, 2012

(54) PACKAGE

(75) Inventors: Tetsuya Takahashi, Kawasaki (JP); Makoto Fukuda, Kawasaki (JP); Hayato Kubo, Kawasaki (JP); Norio Nakamura, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 165 days.

(21) Appl. No.: 12/479,321

(22) Filed: Jun. 5, 2009

(65) Prior Publication Data

US 2009/0301908 A1    Dec. 10, 2009

(30) Foreign Application Priority Data

Jun. 5, 2008 (JP) ................................. 2008-148655

(51) Int. Cl.
*B65D 69/00* (2006.01)
*B65D 85/30* (2006.01)
(52) U.S. Cl. .......................... 206/223; 206/525; 206/723
(58) Field of Classification Search .................. 206/386, 206/600, 701, 722–724, 223, 229, 525, 577; 229/117.28, 120.01, 199
See application file for complete search history.

(56) References Cited

U.S. PATENT DOCUMENTS

| | | | | |
|---|---|---|---|---|
| 1,735,082 A | * | 11/1929 | Martin | 62/60 |
| 1,843,038 A | * | 1/1932 | McIlvain | 62/60 |
| 2,925,210 A | * | 2/1960 | Fallert | 229/122.3 |
| 4,027,794 A | * | 6/1977 | Olson | 206/395 |
| 4,426,015 A | * | 1/1984 | Preston et al. | 229/117.28 |
| 7,159,715 B2 | * | 1/2007 | Cornelius et al. | 206/421 |
| 2003/0057131 A1 | * | 3/2003 | Diaferia | 206/719 |
| 2009/0101538 A1 | * | 4/2009 | Chen et al. | 206/722 |

FOREIGN PATENT DOCUMENTS

| | | |
|---|---|---|
| JP | 5-46778 | 6/1993 |
| JP | 6-44856 | 11/1994 |
| JP | 3045263 | 11/1997 |
| JP | 2005-153917 | 6/2005 |
| WO | WO 01/00494 | 1/2001 |

* cited by examiner

*Primary Examiner* — Luan K Bui
(74) *Attorney, Agent, or Firm* — Fujitsu Patent Center

(57) ABSTRACT

There is provided a package of which package objective article is transferred to an up-and-down lift easily even if the package objective article is heavy.

A package includes a base portion. The base portion includes a top face opening type of an outer box and a top face opening type of an inner box housed in the outer box. A beam is provided under the outer box. Four columns are arranged on four corners in the inner box. Two columns are arranged in the inner box. The base portion has a top board. The top board is supported by the columns, and is set in the inner box. A buffer member is set on the upper face of the top board. The buffer member acts as an article mounting portion. And, an upper face of the buffer member acts as an article mounting face. The article mounting face is positioned higher than a table face of an up-and-down lift.

8 Claims, 27 Drawing Sheets

Fig.13A
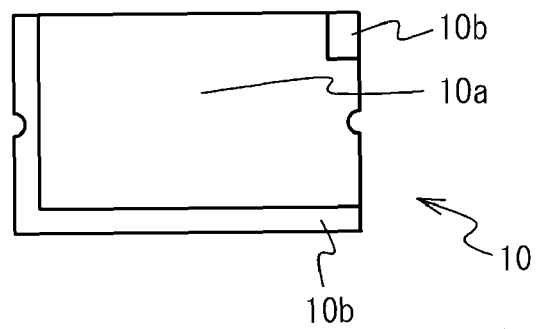
Fig.13D  Fig.13B  Fig.13C
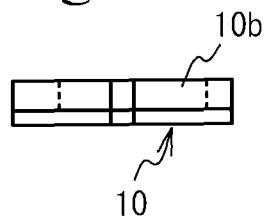 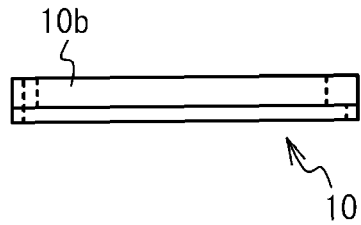 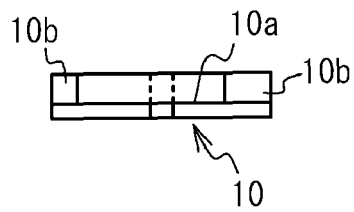
Fig.13E
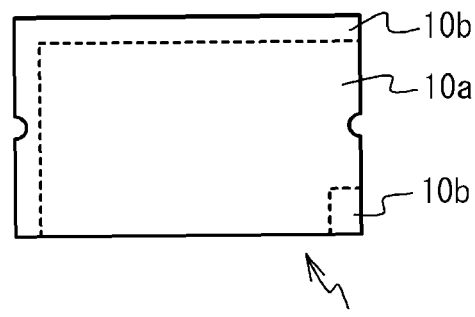
Fig.13F
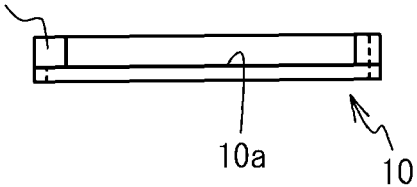

PACKAGE

CROSS-REFERENCE TO RELATED APPLICATION

This application is based upon and claims the benefit of priority of the prior Japanese Patent Application No. 2008-148655, filed on Jun. 5, 2008, the entire contents of which are incorporated herein by reference.

FIELD

A certain aspect of embodiments relates to a package packaging an article and a packed electronic device.

BACKGROUND

Conventionally, a transportation package and a package box are used when an article is transported. For example, a transportation package having a pallet and an outer box fixed on the pallet is known (referring to Japanese Patent Application Publication No. 2005-153917). A package box that is a bended board and has a square bottom board, four sidewalls, and an upper cover, wherein one of the four sidewalls can be opened in addition to the cover, is known (referring to International Publication No. 01/00494 pamphlet).

However, a specific consideration is not made on the transportation package and the package box, as for setting of a package objective article at high position, in particular, setting a heavy package objective article at high position such as a rack with use of an up-and-down lift.

An operator raises the package objective article once and transfers the package objective article on a table of the up-and-down lift, when setting the package objective article housed in a transportation package or in a package box with use of the up-and-down lift. In this case, many operators are needed for the transferring according to weight of the package objective article.

However, many operators are not always prepared at an area for setting of the article. And, a device for transferring of the package objective article to the table of the up-and-down lift is not always prepared. Therefore, the package objective article is divided into a plurality of parts, and the divided parts are set in order.

In this case, the divided parts are packed separately. If the parts are packed separately, packaging processes are increased. Packaging material and packaging capacity may be increased, and transportation cost may be increased. These are large load against earth environment.

Further, the separated packaging causes increase of unpackaging process. This results in increase of setting-up time at the area for setting of the package objective article.

There is a problem when the package is unpacked and the package objective article is set up at the setting-up area. If the package objective article to be set-up is a device to which many electronic devices are connected, the device is once built up at a factory or the like. The built-up device is shipped after passing each test such as an operation check. At the time, each cable connecting between the electronic devices or between the electronic device and the device main body is detached once. The detached cable is connected to the device again at the setting-up area. An operation certainty of cable connecting may not be guaranteed with respect to the device subjected to the above-mentioned process. The condition where the cable fails to connect the electronic device ant the device boy certainly may cause fault incidence of the device.

SUMMARY

The package disclosed in the description includes a base portion having an article mounting face that is positioned higher than a table face of a table of an up-and-down lift in a condition where the up-and-down lift brings the table down, and an outer covering member that covers a package objective article on the package article mounting face and is detachable in a condition where the package objective article is set on the article mounting face.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

BRIEF DESCRIPTION OF DRAWINGS

FIG. 6B illustrates a side view of the outer box to which the beam is attached to.

FIG. 13A illustrates a top view; FIG. 13B illustrates a front view; FIG. 13C illustrates a right side view; FIG. 13D illustrates a left side view; FIG. 13E illustrates a bottom view; and FIG. 13F illustrates a back view.

DESCRIPTION OF EMBODIMENTS

Figure 1:
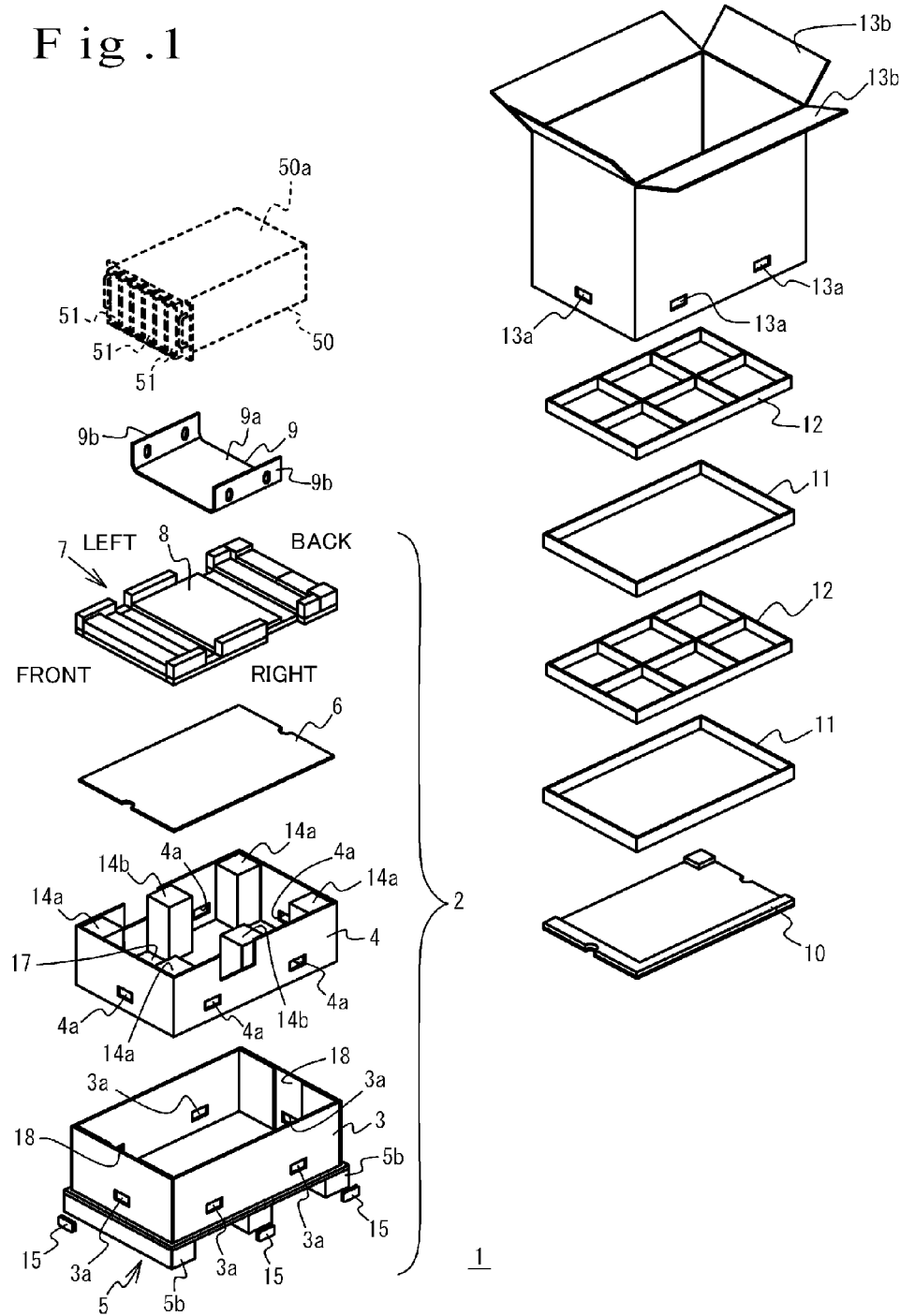
FIG. 1 illustrates a diffusion development view of a package.

A device 50 is a package objective article of a package 1 illustrated in FIG. 1. The device 50 has a plurality of electronic devices 51. The electronic device 51 is installed in a device main body 50a. The device 50 is set on a rack being an example of a housing chassis and is used. For example, the device main body 50a is a chassis. Each of the electronic devices 51 is a server blade installed in the chassis. The rack is a housing chassis that is capable of housing a plurality of the chassis including the server blade. The package 1 houses the electronic device 51 as the device 50 installed in the device main body 50a. The electronic device 51 is shipped and transported as a packed electronic device from a factory. An up-and-down lift 100 illustrated in FIG. 2 and FIG. 23 through FIG. 26 is used when the device 50 is set on the rack. The up-and-down lift 100 has a table 101 and a caster 102, the table 101 rising and falling with a linkage 103.

At first, a description will be given of an overall structure of the package 1 with reference to FIG. 1 illustrating diffusion exploded view of the package 1. FIG. 1 defines front side, back side, left side, and right side of the package 1 in order to simplify the following description.

The package 1 includes a base portion 2. The base portion 2 includes an outer box 3 of which top face is opened and an inner box 4 housed in the outer box 3. A beam 5 is provided under the outer box 3. An insert hole 3a is formed in the outer box 3 so that a joint 15 is to be inserted in the insert hole 3a. Four columns 14a are arranged on four corners in the inner box 4. Two columns 14b are arranged in the inner box 4. An insert hole 4a is formed in the inner box 4 so that the joint 15 is to be inserted in the insert hole 4a.

Figure 2:
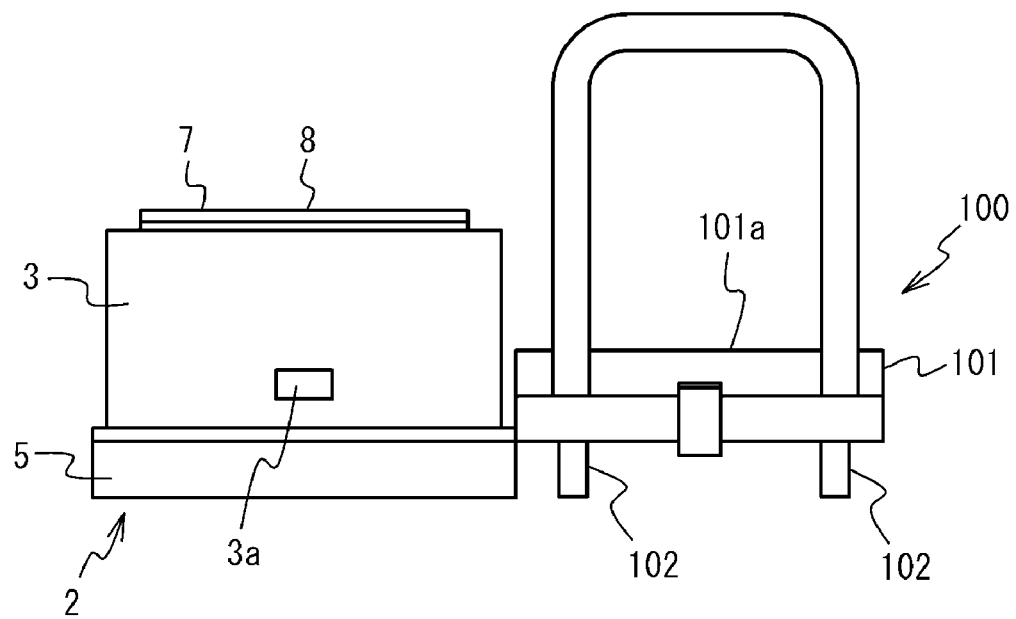
FIG. 2 illustrates an explanatory view of a relation between height of an article mounting dace of a base portion and height of a table face of an up-and-down lift.

The base portion 2 has a top board 6. The top board 6 is supported by the columns 14a and 14b, and is set in the inner box 4. A buffer member 7 is provided on the upper face of the top board 6. The buffer member 7 acts as an article mounting portion. And, an upper face of the buffer member 7 acts as an article mounting face 8. FIG. 2 illustrates an explanatory view of a height relation between the article mounting face 8 of the base portion 2 and a table face 101a of the table 101 of the up-and-down lift 100. The up-and-down lift 100 illustrated in FIG. 2 is on the same floor face as the base portion 2. Further, the table 101 is brought down to a bottom position. In the condition, the article mounting face 8 is positioned higher than the table face 101a of the table 101 of the up-and-down lift 100. The article mounting face 8 has only to be positioned higher than the table face 101a even if the table 101 of the up-and-down lift 100 is not at the bottom position. The buffer member 7 is raised so that the position relation is obtained.

If a package objective article is packed without the buffer member 7, the top board 6 acts as the article mounting portion. The upper face of the article mounting portion acts as the article mounting face. In this case, the article mounting face is positioned higher than the table face 101a of the up-and-down lift 100.

A slide tray 9 is provided on the article mounting face 8. The device 50 is set on the slide tray 9. That is, the slide tray 9 is arranged under the device 50 acting as the package objective article.

A slide sheet 10 is arranged on the device 50 during the packaging. The slide sheet 10 is set on the table face 101a of the table 101 of the up-and-down lift 100 when the article is unpacked and the device 50 is set on the rack. The slide sheet 10 makes the sliding of the heavy device 50 easy.

A box-shaped caddy 11 housing an attached article of the device 50 is arranged on the slide sheet 10. In the embodiment, two of the caddies 11 are stacked on the slide sheet 10. A partition 12 is provided in the caddy 11. The partition 12 compartments the caddy 11 into a plurality of sections. The order of stacking of the slide sheet 10 and the caddy 11 may be reversed. That is, the slide sheet 10 may be arranged on the caddy 11.

The package 1 has an outer covering member 13 that covers the device 50 on the buffer member 7. The outer covering member 13 has a box body and covers from the stacked base portion 2 to the caddy 11. An insert hole 13a is formed in the outer covering member 13 so that the joint 15 is to be inserted in the insert hole 13a. And, the outer covering member 13 has a cover 13b that opens and closes the upper portion of the outer covering member 13.

The packaging process with the package 1 is finished when the outer covering member 13 covers from the stacked base portion 2 to the caddy 11 and the joint 15 is fixed. A description will be given of each component of the package 1 in detail with reference to the following drawings. However, a size or a ratio of each portion may not correspond to those of an actual structure in the drawings. Details may be omitted in the drawings.

A cardboard is used for the material of the package 1 except for the buffer member 7 made of foamed material.

Figure 3A:
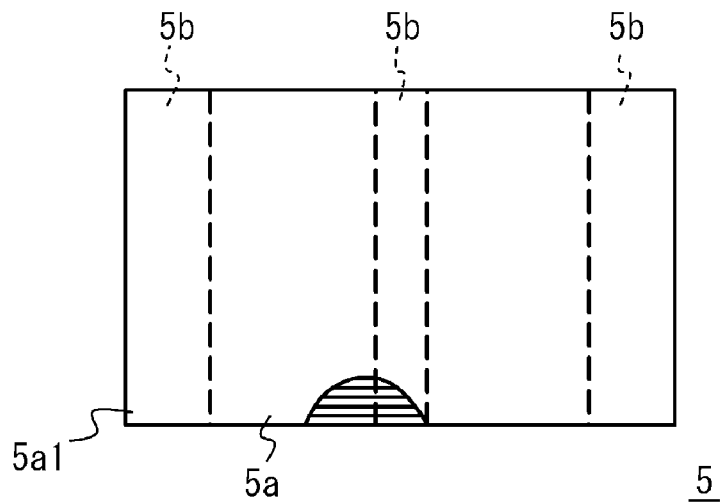
FIG. 3A illustrates a top view of a beam.
Figure 3B:
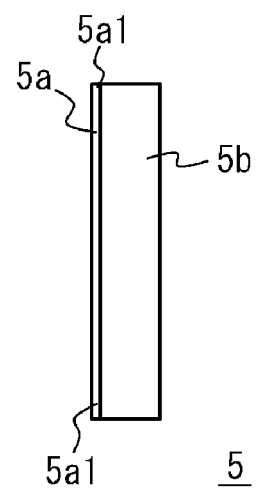
FIG. 3B illustrates a side view of the beam.
Figure 3C:
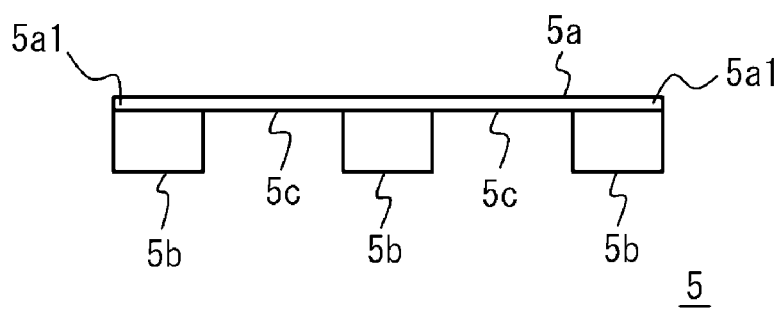
FIG. 3C illustrates a front view of the beam.

FIG. 3A illustrates a top view of the beam 5. FIG. 3B illustrates a side view of the beam 5. FIG. 3C illustrates a front view of the beam 5. The beam 5 is formed by attaching three beam members 5b extending right and left on a board 5a parallel to each other. The beam members 5b are arranged at a given interval. And a fork insert groove 5c for a forklift is formed. In the beam member 5b, a plurality of cardboards are laminated and adhered to each other. An outer size of the board 5a is larger than that of the outer box 3 so that the outer covering member 13 is arranged on a circumference edge portion 5a1.

Figure 4:
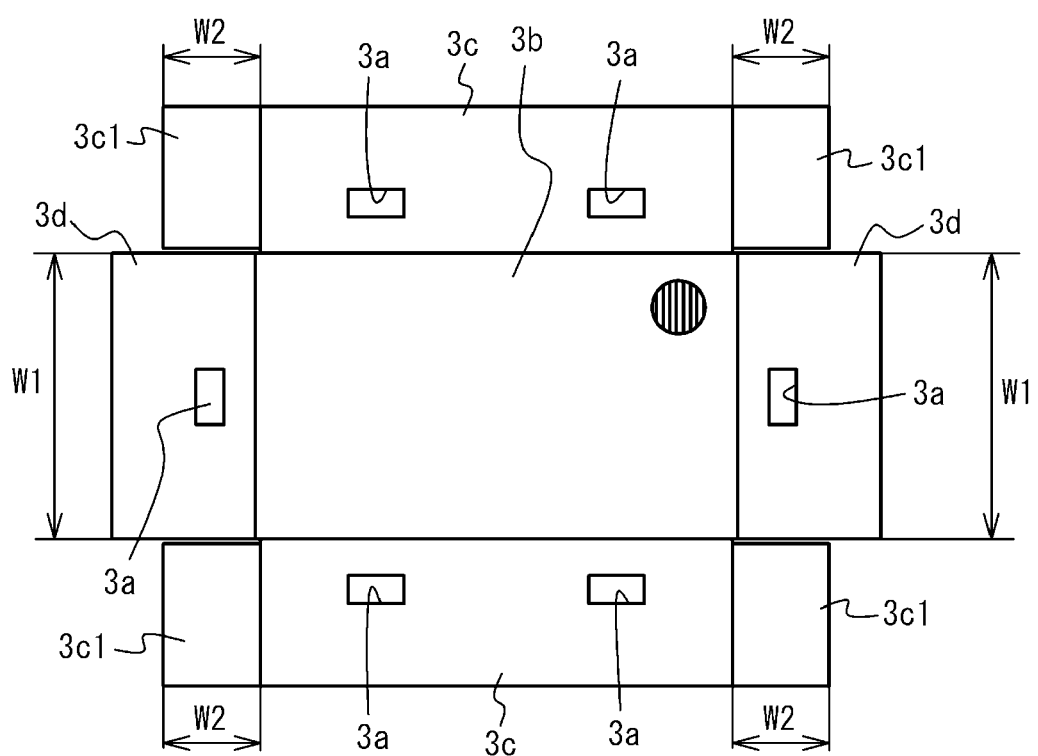
FIG. 4 illustrates a top view of an expanded outer box.

FIG. 4 illustrates a development top view of the outer box 3. The upper face of the outer box 3 is opened in a condition where the outer box 3 is built up. The inner box 4 is housed in the outer box 3 easily because the upper face of the outer box 3 is opened.

Figure 5:
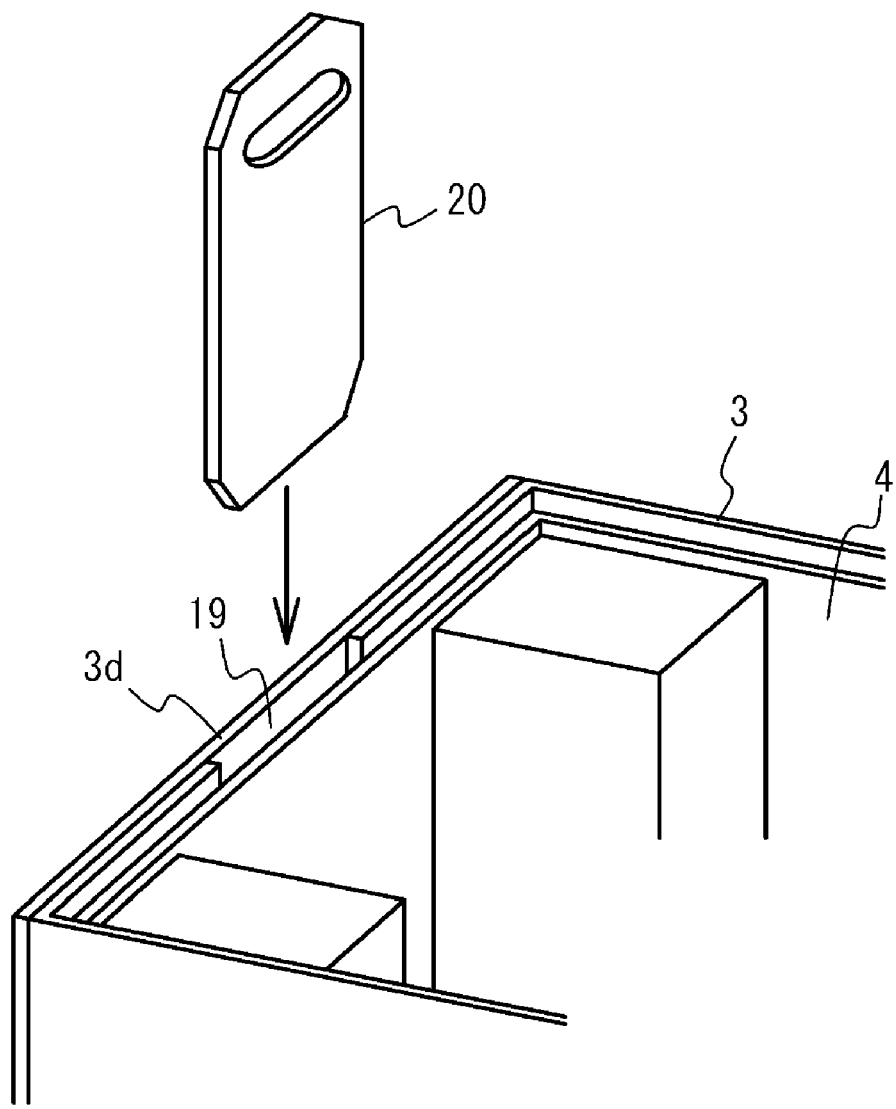
FIG. 5 illustrates an explanatory view of an enlarged part around a jig insert portion formed between an outer box and an inner box.

The outer box 3 has a pair of first sidewall 3c on the left side and the right side continuing from a bottom portion 3b and has a pair of second sidewall 3d on the front side and the back side continuing from the bottom portion 3b. An overlapping portion 3c1 is continuing from the first sidewall 3c and is overlapped with and adhered to the second sidewall 3d when the outer box 3 is built up. A width W2 of the overlapping portion 3c1 is a half or less of a width W1 of the second sidewall 3d. Thus, a groove 18 is formed as illustrated in FIG. 1 when the outer box 3 is built up. The groove 18 acts as a jig insert portion 19 between the outer box 3 and the inner box 4 where a jig 20 is to be inserted, when the inner box 4 is housed in the built-up outer box 3, as illustrated in FIG. 5. The jig 20 acts as a guide when the top board 6, the buffer member 7, the slide tray 9 and the device 50 are arranged. If an article is packed with the jig 20 being inserted in the jig insert portion 19, each position of components are easily determined. The jig 20 may have a taper shape of which width is gradually reduced toward an end part so that the jig 20 is easily inserted in the jig insert portion 19.

Figure 6A:
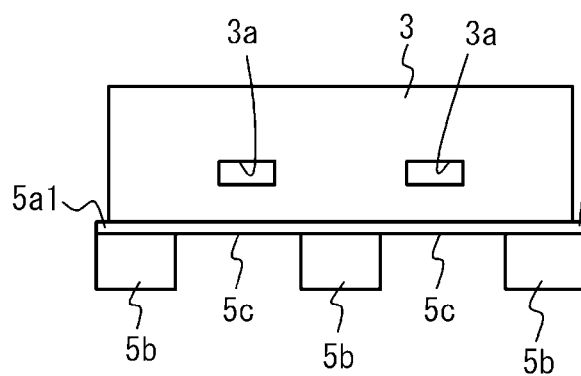
FIG. 6A illustrates a top view of an outer box to which a beam is attached.
Figure 6B:
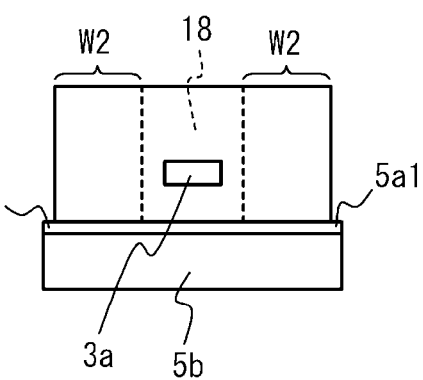

The first sidewall 3c and the second sidewall 3d have the insert hole 3a for the joint 15. The beam 5 is attached to the bottom of the built-up outer box 3 with adhering. FIG. 6A illustrates a front view of an aspect where the beam 5 is attached to the outer box 3. FIG. 6B illustrates a side view the aspect.

Figure 7A:
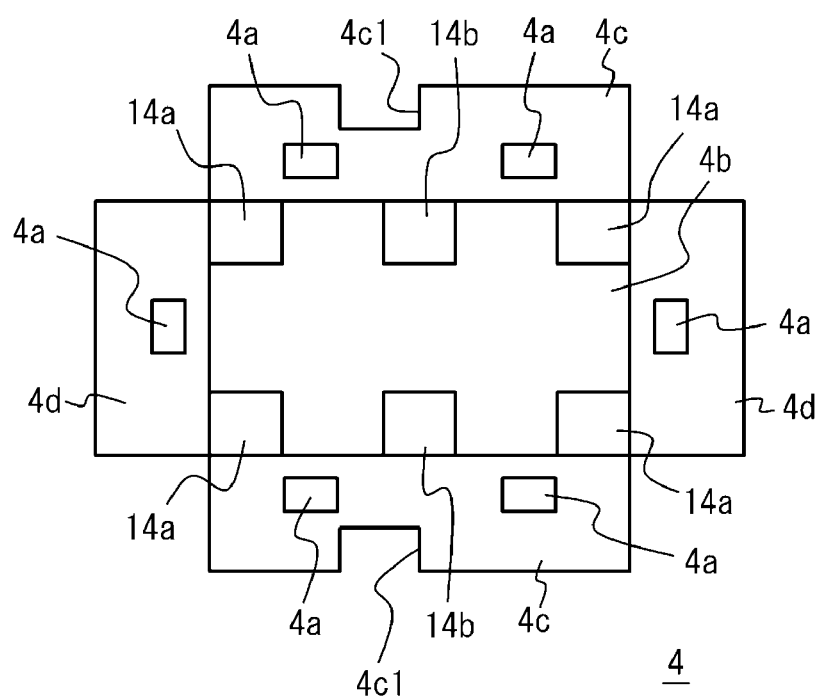
FIG. 7A illustrates a top view of an expanded inner box.
Figure 7B:
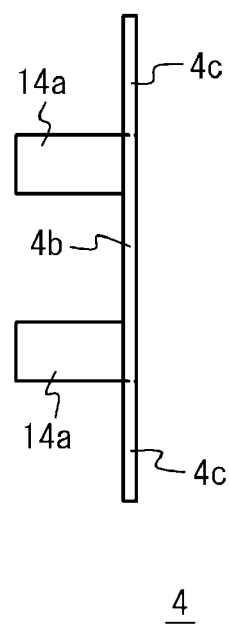
FIG. 7B illustrates a side view of the expanded inner box.

FIG. 7A illustrates a top view of the expanded inner box 4. FIG. 7B illustrates a side view of the expanded inner box 4. The built-up inner box 4 is an upper face opening type of box body. A space in the inner box 4 may be used as a housing portion of accessories, as described later. The accessories are housed in the inner box 4 easily, because the upper face of the inner box 4 is opened. Therefore, taking out and putting in of the accessories are easy.

The inner box 4 has a pair of first sidewall 4c on the left side and the right side continuing from a bottom portion 4b and has a pair of second sidewall 4d on the front side and the back side of the bottom portion 4b continuing from the bottom portion 4b. The first sidewall 4c has a cutting region 4c1. The cutting region 4c1 is formed at a top end of the built-up inner box 4. The column 14a stands on each of four corners of the bottom portion 4b. The column 14b stands at a position overlapping with the cutting region 4c1 of the built-up inner box 4. The columns 14a and 14b have a structure in which a plurality of cardboards are laminated and adhered to each other. The columns 14a and 14b strengthen the base portion 2. In particular, the device 50 acting as a package objective article is set on the base portion 2. The device 50 is a heavy load. Therefore, the size, the shape and the arrangement of the columns 14a and 14b are determined from a viewpoint of supporting of the device 50.

Figure 8:
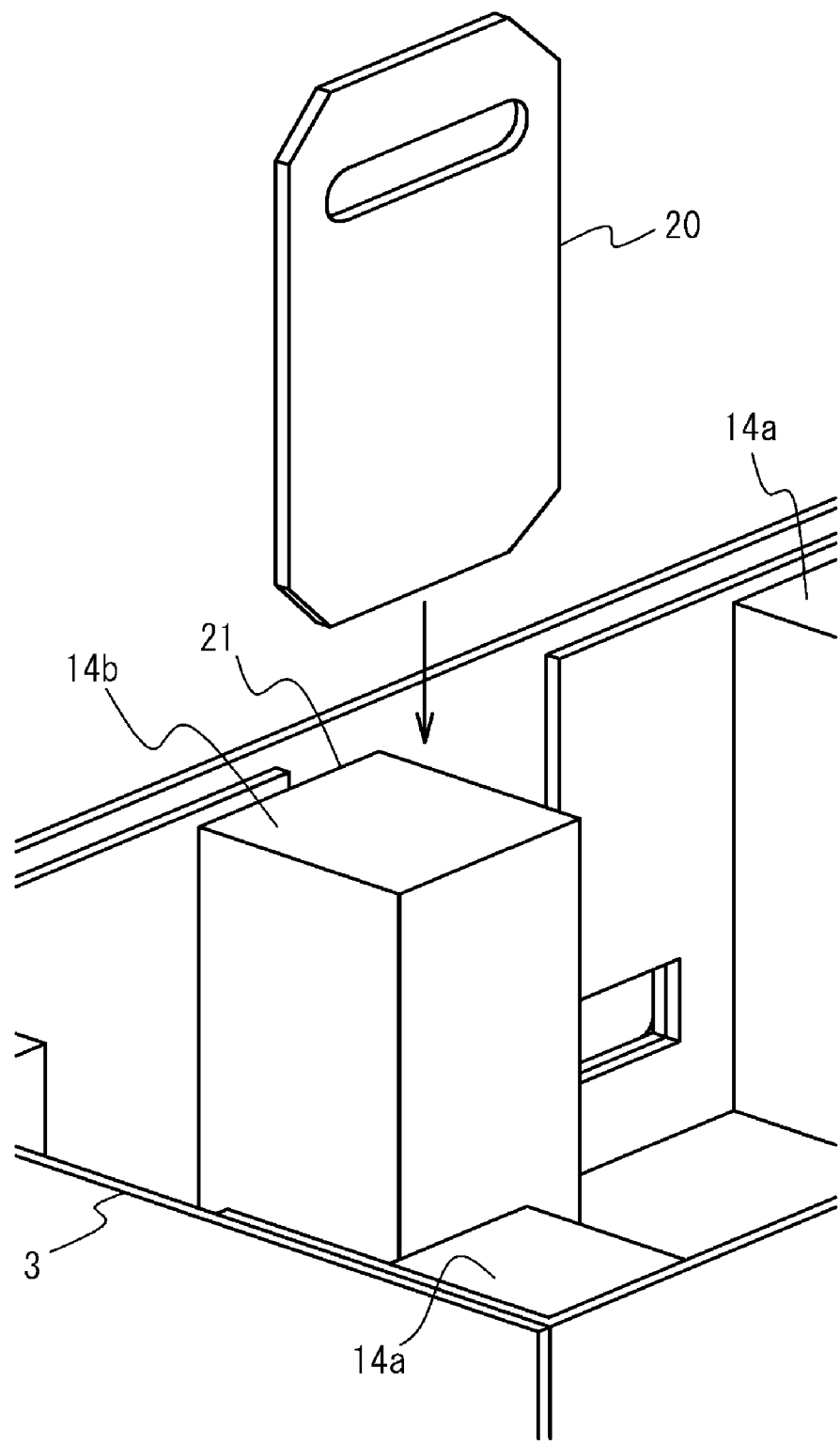
FIG. 8 illustrates an explanatory view of an enlarged part around a jig insert portion formed between a column and an outer box.

The cutting region 4c1 forms a space between the column 14b and the outer box 3 as illustrated in FIG. 8 when the inner box 4 is housed in the built-up outer box 3. The space acts as a jig insert portion 21 where the jig 20 is to be inserted. If an article is packed with the jig 20 being inserted in the jig insert portion 21, each position of components such as the top board 6 is easily determined as is the case of the jig insert portion 19.

Figure 15:
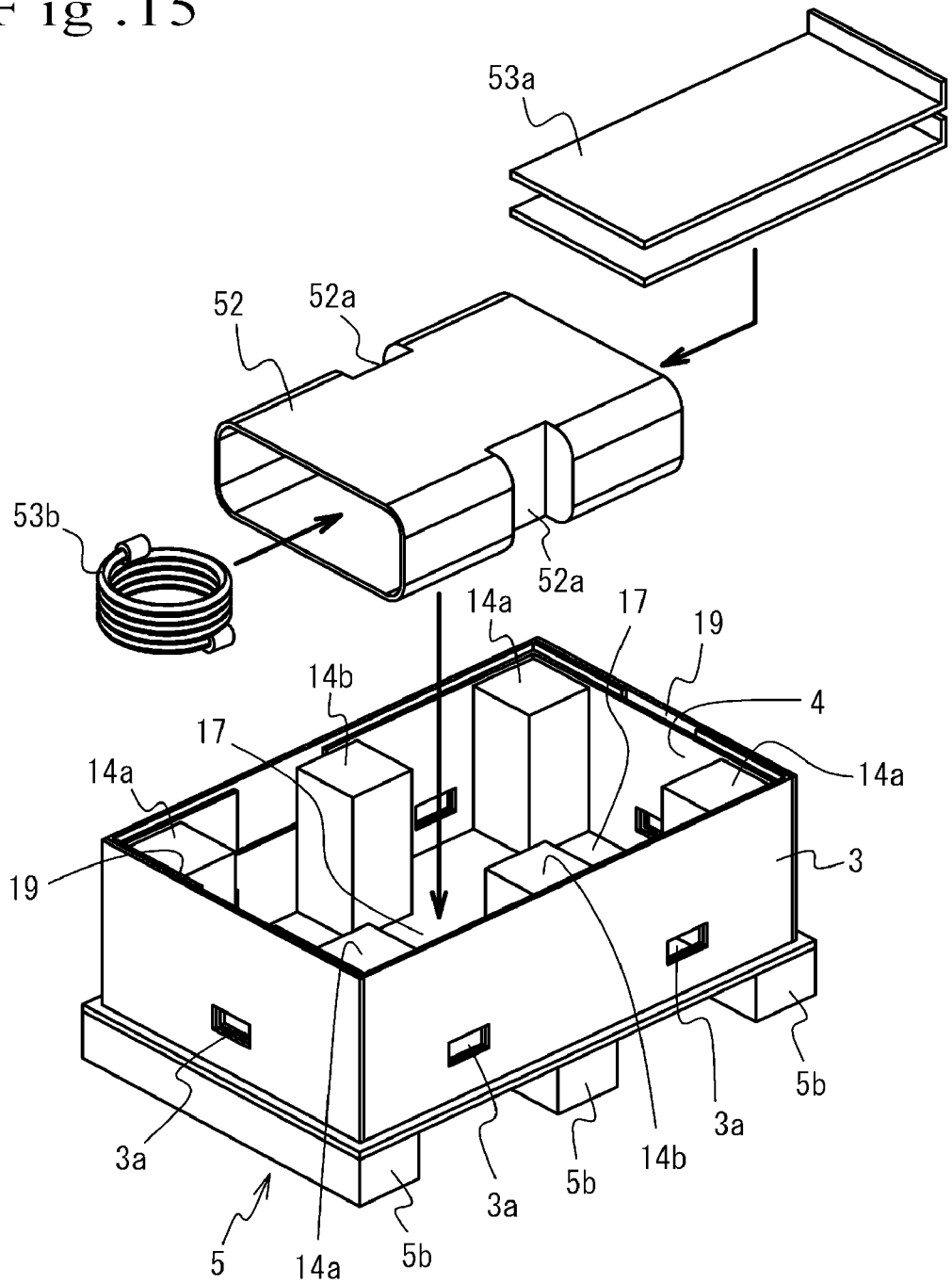
FIG. 15 illustrates an explanatory view of an operation in which an accessory is housed in an accessory box, and the accessory box is housed in an inner box.

Space is formed between the column 14a and the column 14b. Therefore, the base portion 2 has a space 17 housing accessories of the device 50 housed in an accessory box 52 as illustrated in FIG. 15. The accessory housed in the accessory box 52 is a rail kit 53a and a power supply cable 53b used for setting of the device 50 on a rack. The size, the shape, and the arrangement of the columns 14a and 14b are determined in view of the weight of the package objective article. The size, the shape and the arrangement of the columns 14a and 14b may be optionally changed within a range where the size, the shape and the arrangement satisfy the supporting condition of a heavy load. So, the columns 14b are arranged so as to hold the accessory box 52 housed in the space 17, as illustrated in FIG. 15. In concrete, a groove 52a formed in the accessory box 52 is engaged with the column 14b. Thus, movement of the accessory box 52 during transportation is restrained.

Figure 9:
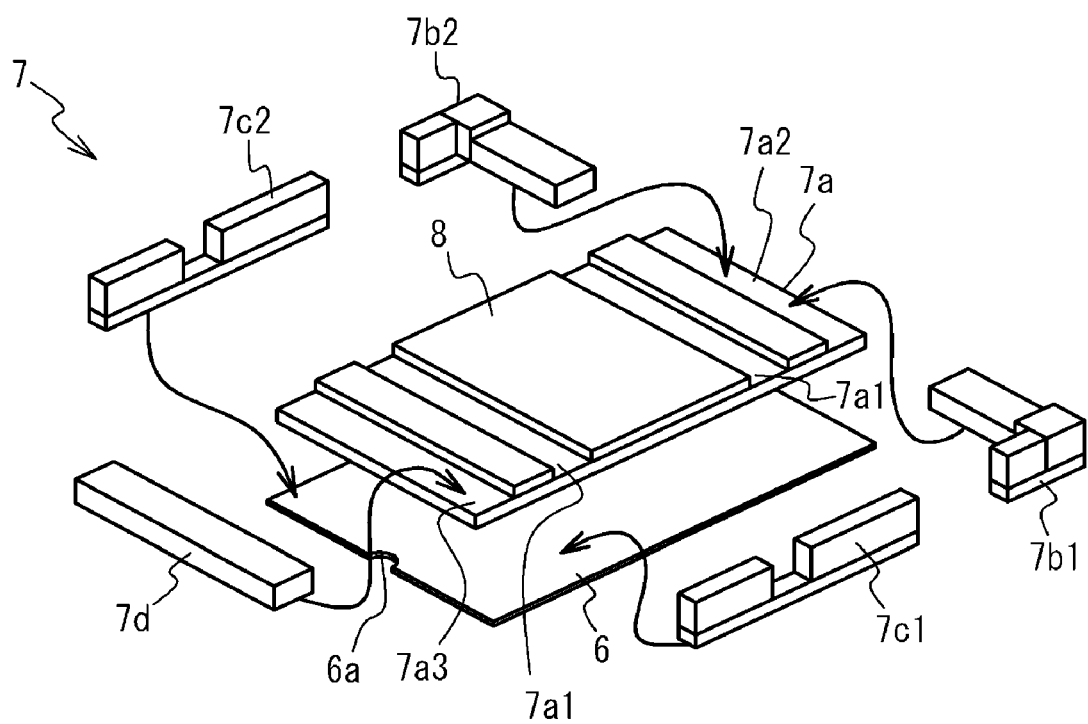
FIG. 9 illustrates a diffusion expansion view of a buffer member and a top board on which the buffer member is provided.

FIG. 9 illustrates a development exploded view of the buffer member 7 and the top board 6 on which the buffer member 7 is to be set. The top board 6 is arranged in the outer box 3, and is set on the columns 14a and 14b provided in the inner box 4. The top board 6 has a half-moon shaped cutting region 6a at a circumference edge thereof. An operator can look at inside of the inner box 4 through the cutting region 6a and can observe the inside of the inner box 4. The operator can raise the top board 6 by inserting a finger in the cutting region 6a when the operator removes the top board 6.

The buffer member 7 is divided into a plurality of parts. The buffer member 7 includes a base block 7a to which the device 50 acting as the package objective article is loaded vertically. The buffer member 7 includes a back right block 7b1, a back left block 7b2, a front right block 7c1, and a front left block 7c2 arranged around the base block 7a. The buffer member 7 includes a front face pressing block 7d for pressing a front face of the device 50. The base block 7a has two grooves 7a1. The groove 7a1 is used when a raising band for raising the device 50 during the packaging is extracted. Thickness of a back end edge 7a2 and a front end edge 7a3 of the base block 7a is reduced.

The base block 7a is set on the top board 6. The size of the base block 7a in left and right direction is smaller than that of the top board 6.

A part of the back right block 7b1 extending in front and back direction is positioned on a region of the top board 6 on the right side of the base block 7a. And, a part of the back right block 7b1 extending in right and left direction is set on the back end edge 7a2 of the base block 7a. A part of the back left block 7b2 extending in front and back direction is positioned on a region of the top board 6 on the left side of the base block 7a. A part of the back left block 7b2 extending in right and left direction is set on the back end edge 7a2 of the base block 7a.

The front right block 7c1 is set on the top board 6 on the right side of the base block 7a. The front left block 7c2 is set on the top board 6 on the left side of the base block 7a.

The front face pressing block 7d is set on the front end edge 7a3. In the divided buffer member 7, only the base block 7a is subjected to the load. Therefore, the back right block 7b1, the back left block 7b2, the front right block 7c1, the front left block 7c2 and the front face pressing block 7d are detachable in a condition where the device 50 is set on the buffer member 7.

Figure 10:
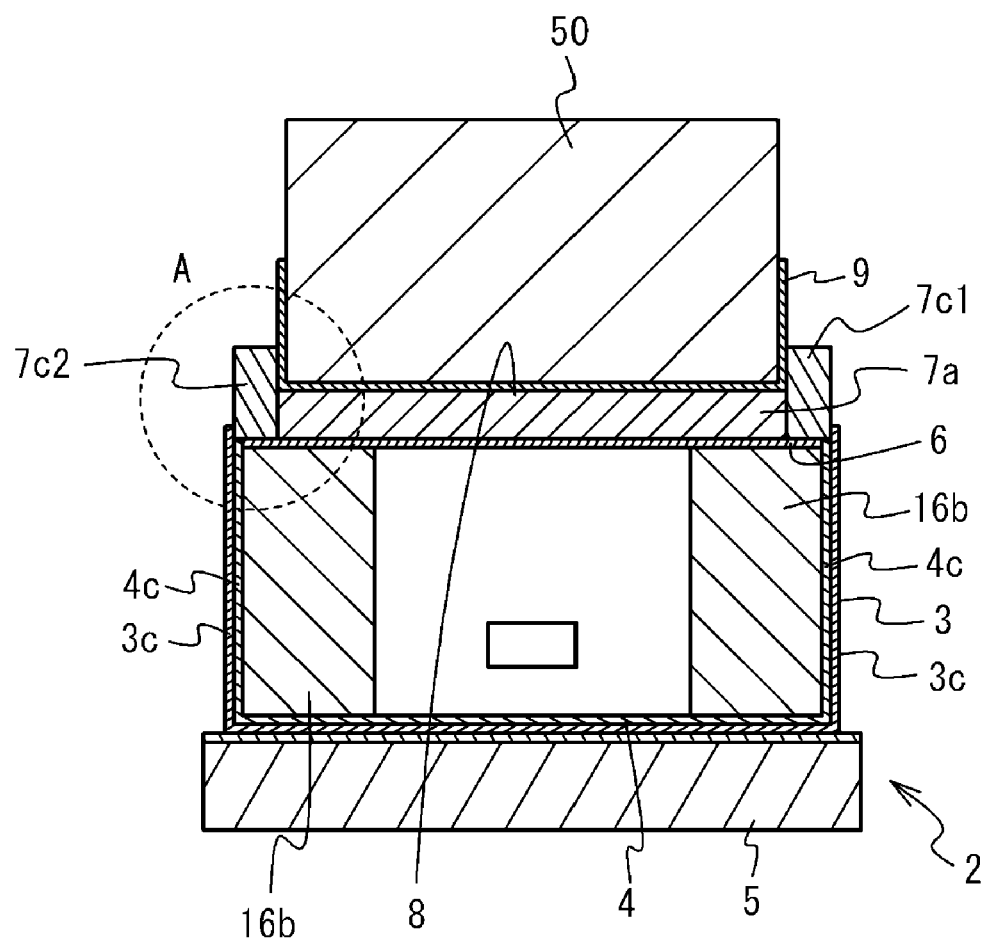
FIG. 10 illustrates a cross sectional view of a base portion and a device set on the base portion.
Figure 11:
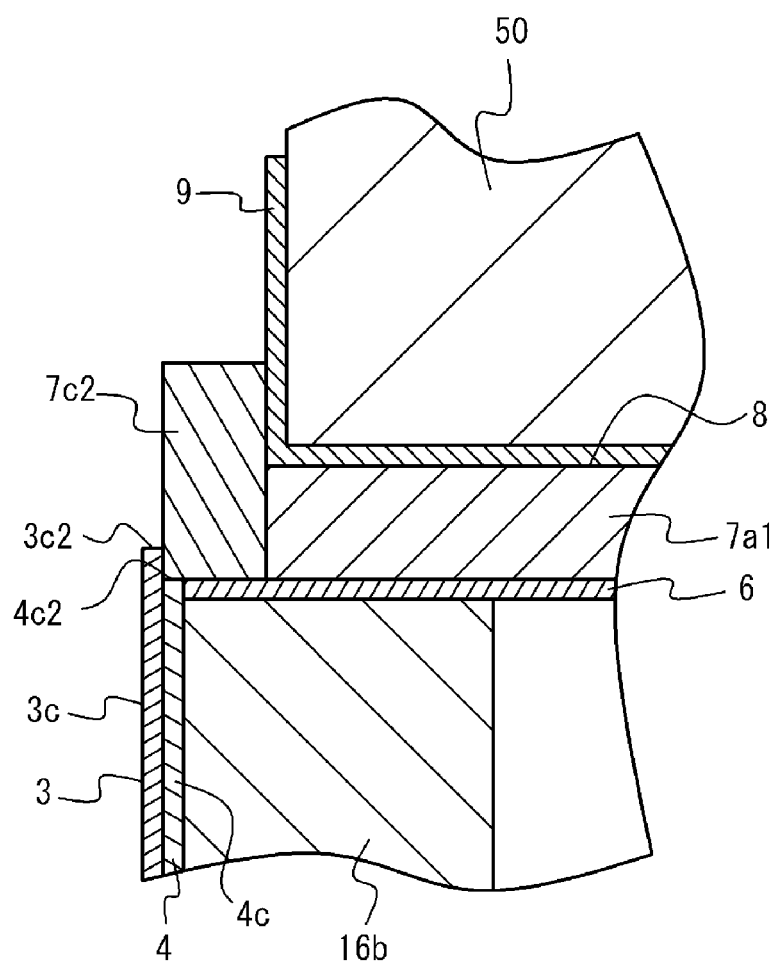
FIG. 11 illustrates an enlarged view of an area surrounded with a circle A of FIG. 10.

FIG. 10 illustrates a cross sectional view of an aspect in which the device 50 is set on the base portion 2. FIG. 11 illustrates an enlarged view of a region surround by a circle A of FIG. 10. As is obvious in FIG. 10 and FIG. 11, the position of the article mounting face 8 is higher than an upper edge 3c2 of the first sidewall 3c of the outer box 3 and an upper edge 4c2 of the first sidewall 4c of the inner box 4. With the positional relation, the upper edge 3c2 of the first sidewall 3c of the outer box 3 and the upper edge 4c2 of the first sidewall 4c of the inner box 4 fail to prevent the transferring of the device 50 when the device 50 on the slide tray 9 is slid to the table 101.

The position of the upper edge 3c1 of the first sidewall 3c of the outer box 3 is higher than that of the upper edge 4c1 of the first sidewall 4c of the inner box 4. The top board 6 and the upper edge 4c1 of the first sidewall 4c of the inner box 4 are approximately on the same plane. The base block 7a is set on the top board 6. The front right block 7c1 and the front left block 7c2 are inserted and held between the base block 7a and the first sidewall 3c of the outer box 3. The back right block 7b1 and the back left block 7b2 are inserted and held between the base block 7a and the first sidewall 3c of the outer box 3. Therefore, the transferring of the device 50 in the right and left direction is restrained. The transferring of the device 50 in the front and back direction is restrained by the back right block 7*b*1, the back left block 7*b*2, and the front face pressing block 7*d*.

Figure 12:
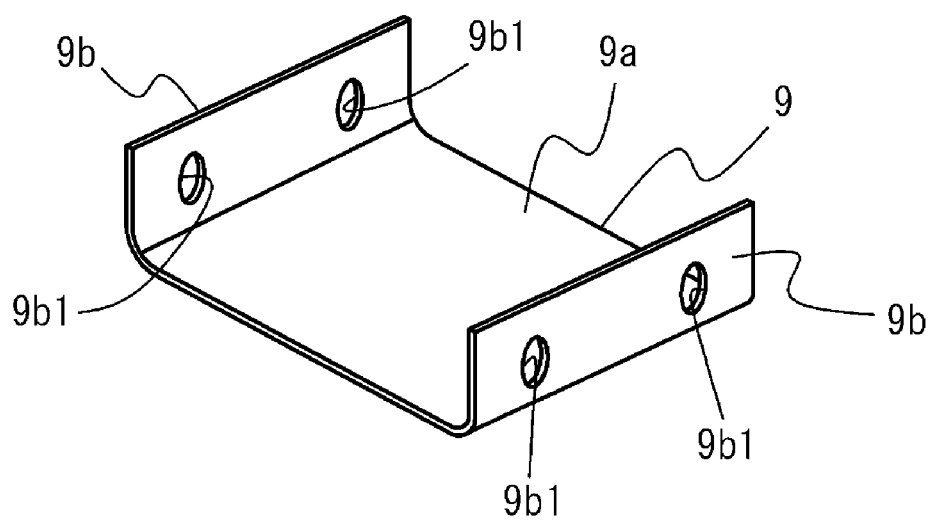
FIG. 12 illustrates a perspective view of a slide tray.

FIG. 12 illustrates a perspective view of the slide tray 9. The slide tray 9 slides the device 50 with the device 50 being mounted on the slide tray 9. The slide tray 9 has a flap 9*b* acting as a grip on the left side and the right side of the center plane portion 9*a*. The flap 9*b* has a structure in which both sides of a single cardboard are bended upward. The flap 9*b* has an oval holding hole 9*b*1 of which longitudinal direction is vertical direction during the packaging. The holding hole 9*b*1 restrains operation of an operator raising the device 50 with use of the holding hole 9*b*1, because the longitudinal direction of the oval shape of the holding hole 9*b*1 is along the vertical direction. It is difficult to transfer the device 50 if the operator forcedly raises the heavy device 50 with use of the holding hole 9*b*1. That is, the finger of the operator is not engaged with the holding hole 9*b*1 well. The operator feels pain in the finger if the operator forcedly raises the device 50. The operator detects that the holding hole 9*b*1 will be broken from the edge engaged with the finger. With the reasons, it is restrained that the operator transfers the device 50 in improper position or motion. On the other hand, it is easy to slide the device 50 with use of the holding hole 9*b*1.

FIG. 13A through FIG. 13F illustrate six orthogonal views of the slide sheet 10. FIG. 13A illustrates a top view. FIG. 13B illustrates a front view. FIG. 13C illustrates a right side view. FIG. 13D illustrates a left side view. FIG. 13E illustrates a bottom view. FIG. 13F illustrates a back view.

The slide sheet 10 is set on the table face 101*a* of the up-and-down lift 100. In general, the table face 101*a* is subjected to a nonslip treatment. For example, a rubber sheet is adhered to the table face 101*a* so that an article on the up-and-down lift 100 does not slip. The device 50 packed in the package 1 of the embodiment slides from the base portion 2 to the table face 101*a*. Therefore, the sliding operation is easy if the table face 101*a* is slippery. On the other hand, if the table face 101*a* is extremely slippery, the device 50 sliding fast may fall from the table 101.

And so, the slide sheet 10 has a slippery path 10*a* and a stopper 10*b*. The path 10*a* has a shape along a path on which the device 50 is transferred. The slide sheet 10 is made of a cardboard. Therefore, the exposed surface of the cardboard acts as the path 10*a*. The device 50 transferred on the path 10*a* is mounted on the slide tray 9 made of cardboard. Therefore, the device 50 slides smoothly because friction during the transferring of the device 50 is between cardboards.

The stopper 10*b* is a step made of laminated cardboards around the slide sheet 10.

The path 10*a* may be made of another material that is more slippery than the surface of the cardboard. The stopper 10*b* may be made of non-slippery rubber or the like. The path 10*a* may have another shape.

The slide sheet 10 may be adhered to the table face 101*a* with a tape and be used when the device 50 is actually set on the table face 101*a*.

Figure 14A:
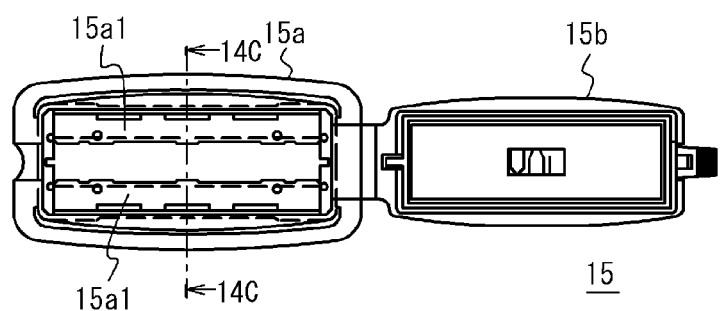
FIG. 14A illustrates a top view of a joint.
Figure 14C:
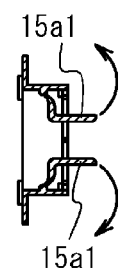
FIG. 14C illustrates a cross sectional view taken along a line B-B of FIG. 14A.
Figure 14B:
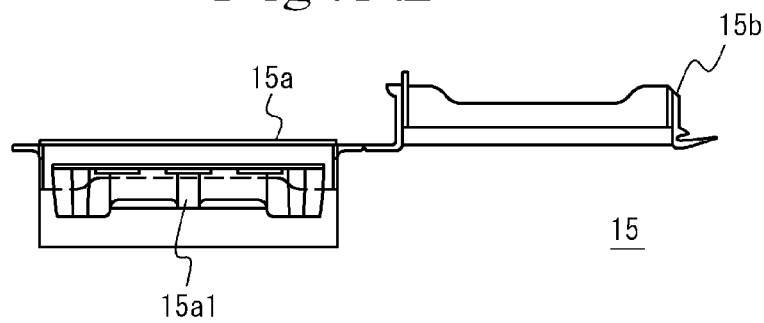
FIG. 14B illustrates a front view of the joint.

FIG. 14A illustrates atop view of the joint 15. FIG. 14B illustrates a front view. FIG. 14C illustrates a cross sectional view taken along with a line B-B of FIG. 14A. The joint 15 has a frame-shaped main body 15*a* and a pressing member 15*b*. The main body 15*a* has an engage portion 15*a*1 having L-shape cross section. The joint 15 fixes a plurality of board members overlapping with each other. The board members are fixed with the following processes. At first, an insert hole is formed in each of connection target boards. The insert holes have the same shape. The main body 15*a* is inserted in the insert holes so as to penetrate the insert holes from front side. After that, the engage portion 15*a*1 is engaged with the back face of the board if the pressing member 15*b* is pressed into the main body 15*a*. The engage portion 15*a*1 is locked when the pressing member 15*b* is locked with the main body 15*a*. Thus, the boards are fixed with each other. The package 1 fixes the outer box 3, the inner box 4, and the outer covering member 13 with the joint 15.

Next, a description will be given of the packaging of the device 50 with the package 1 and the setting of the device 50.

At first, the inner box 4 is housed in the outer box 3 to which the beam 5 is attached as illustrated in FIG. 15. The rail kit 53*a* and the cable 53*b* are housed in the accessory box 52. And, the column 14*b* is engaged with the groove 52*a* formed in the side face of the accessory box 52. Thus, the columns 14*b* hold and fix the accessory box 52.

Figure 16:
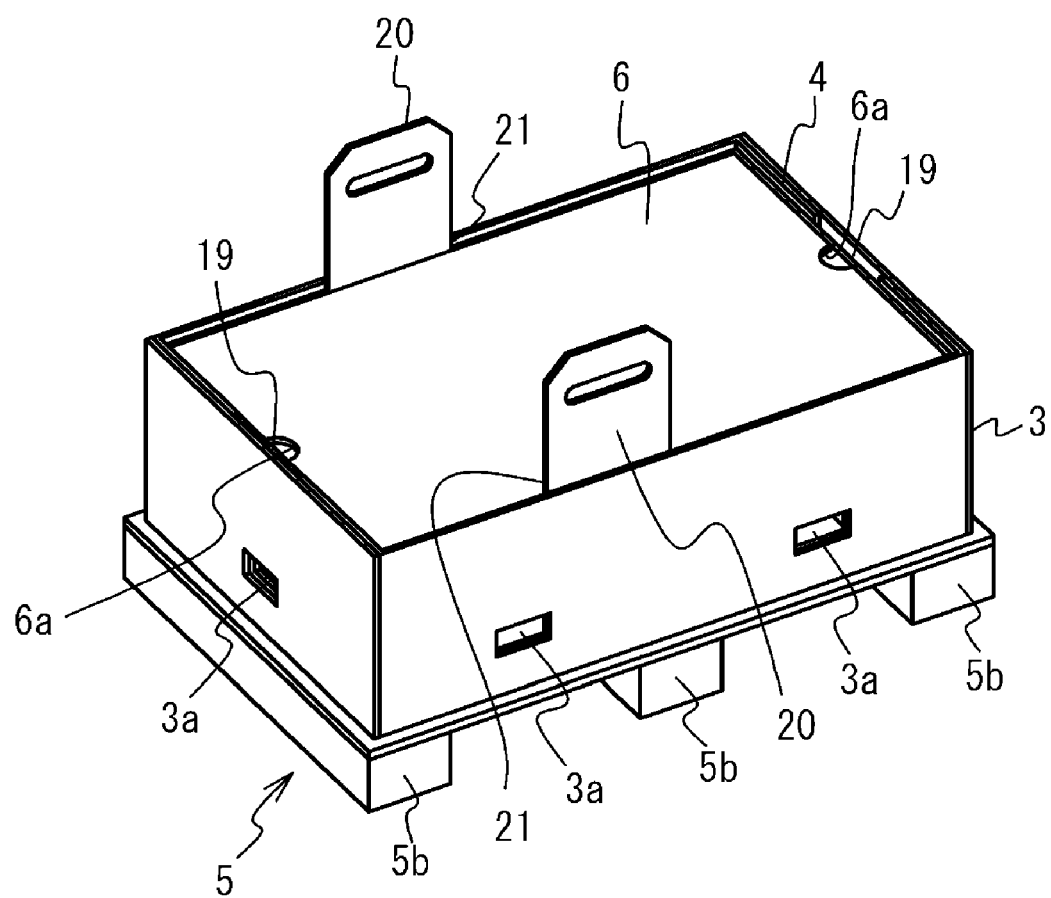
FIG. 16 illustrates a perspective view of an aspect where a jig is inserted in a jig insert portion, and a top board is provided.

Then, the jig 20 is inserted in the jig insert portion 21 as illustrated in FIG. 16. The top board 6 is set in the inner box 4. The jig 20 may be inserted in the jig insert portion 19. The top board 6 may be set in first, and the jig 20 may be inserted after that.

Figure 17:
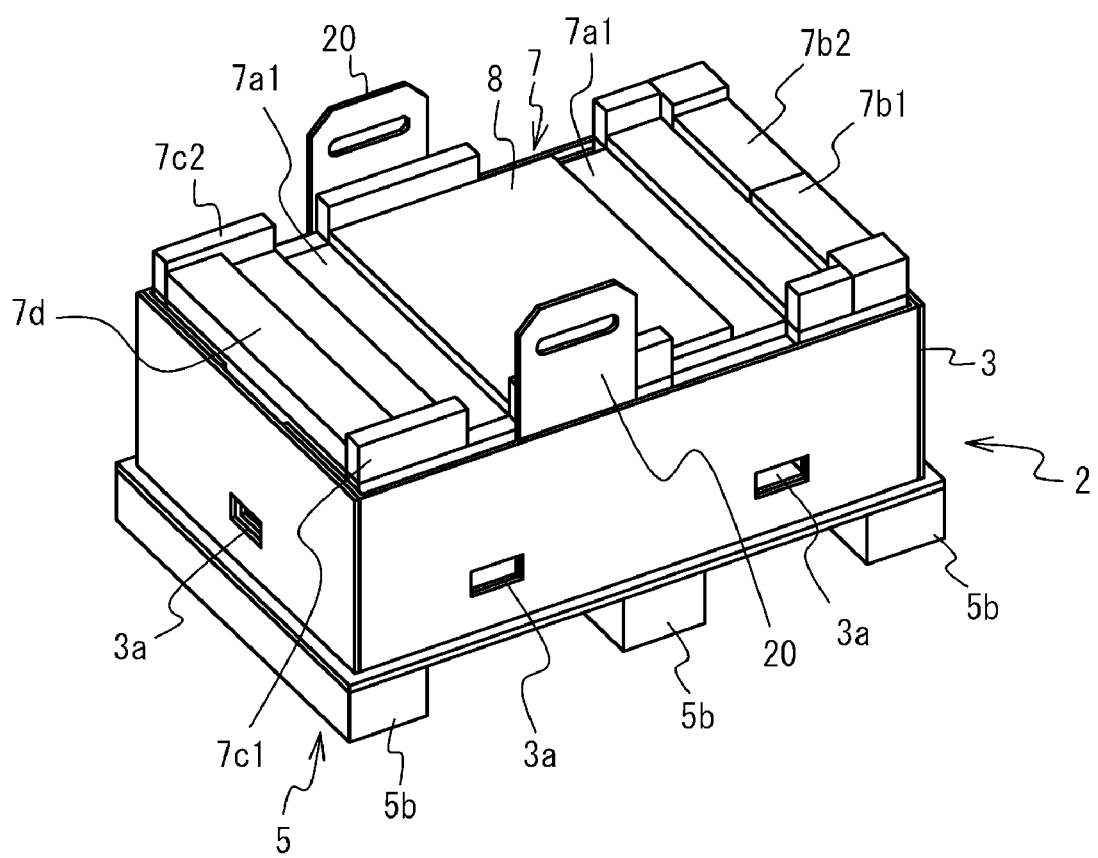
FIG. 17 illustrates a perspective view of an aspect where a buffer member is arranged.
Figure 18:
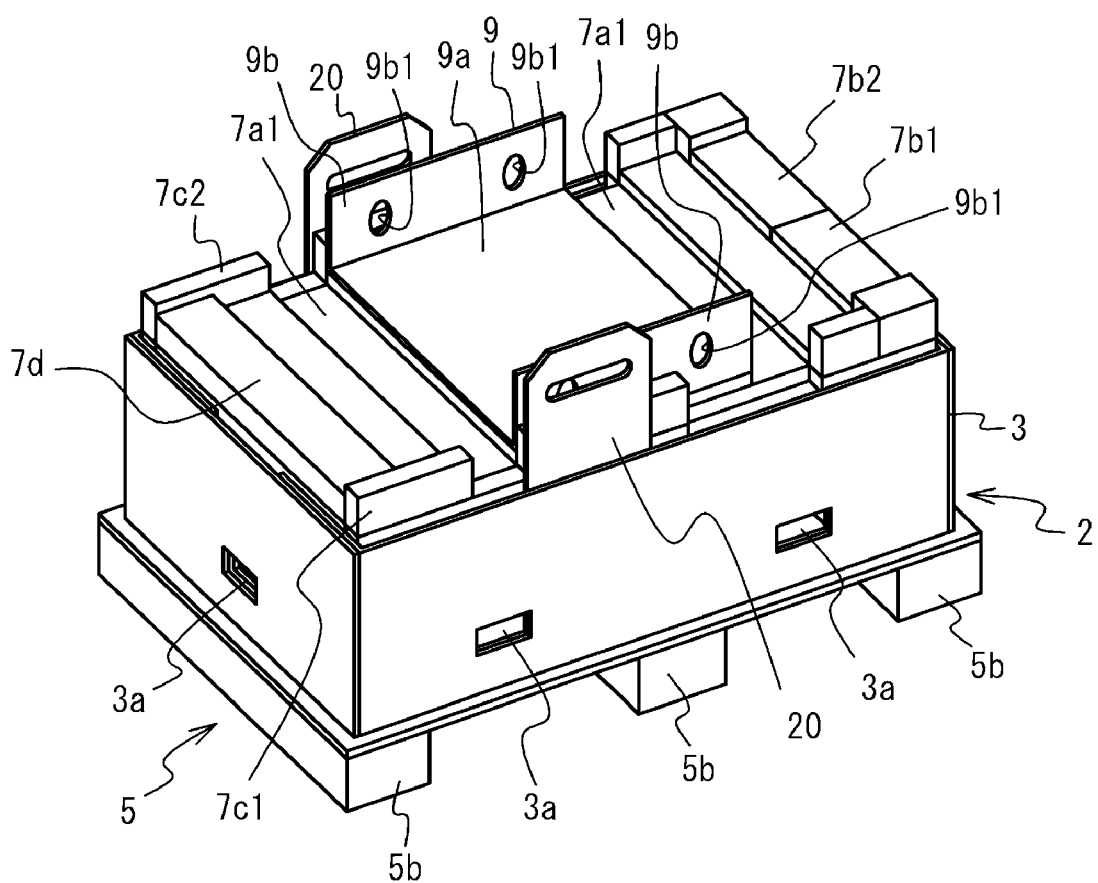
FIG. 18 illustrates a perspective view of an aspect where a slide tray is provided.

Then, the base block 7*a* and each block composing the buffer member 7 are set on the top board 6 as illustrated in FIG. 17. After that, the slide tray 9 is set on the article mounting face 8 of the base block 7*a* as illustrated in FIG. 18. A cover or a cover paper for covering the device 50 may be arranged on the slide tray 9.

And, the device 50 is set on the base block 7*a*. The necessary electronic device 51 is fixed to the device main body 50*a* at a factory. And the device 50 is subjected to some tests. The device 50 is packed without detaching of a connector or taking apart after passing the tests.

Figure 19:
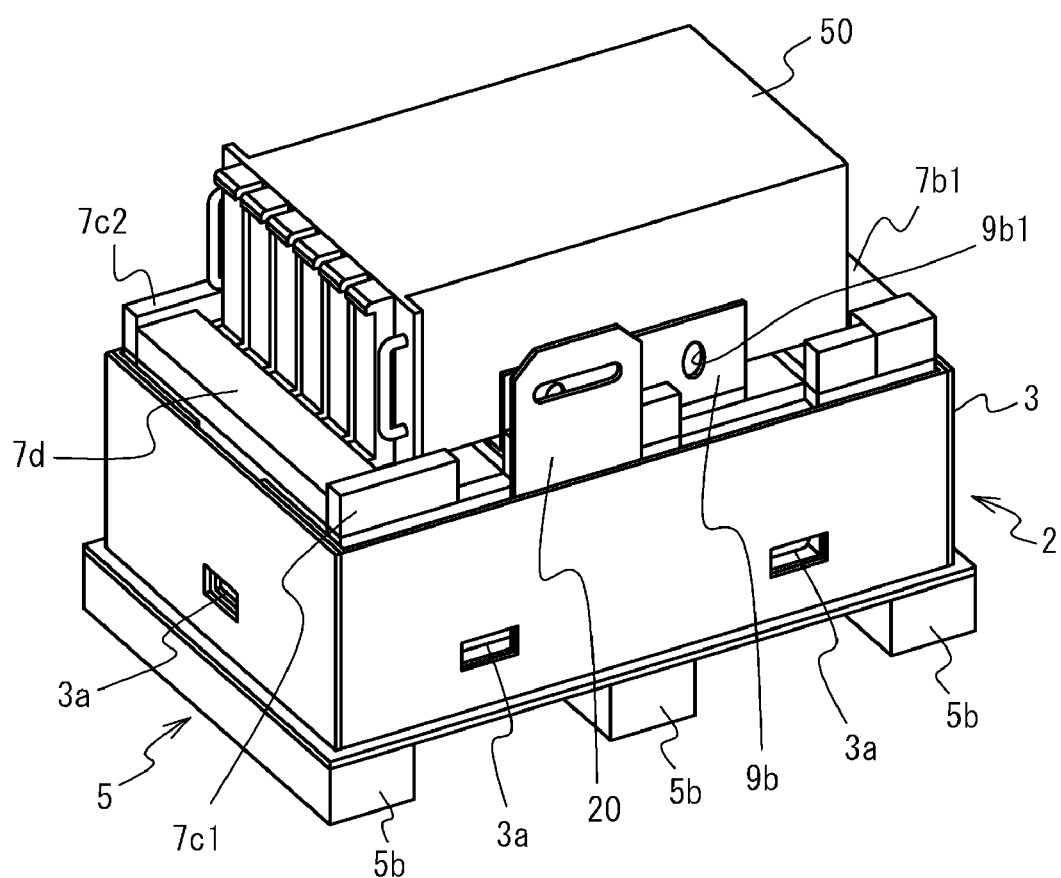
FIG. 19 illustrates a perspective view of an aspect where a device is arranged.

A suspending band not illustrated is tied to the device 50 when the device 50 is set on the article mounting face 8 of the base block 7*a*. The suspending band is tied to the device 50 according to the position of the groove 7*a*1 formed on the base block 7*a*. The device 50 is raised with the suspending band and is transferred to the base block 7*a*. The suspending band is easily extracted along the groove 7*a*1 formed on the base block 7*a* after the transferring. FIG. 19 illustrates a perspective view of an aspect where the device 50 is arranged.

The flap 9*b* of the slide tray 9 is fixed with a tape so that the flap 9*b* is not opened, after setting the device 50 on the article mounting face 8. The flaps 9*b* are connected to each other with the tape.

Then, the slide sheet 10 is arranged on the device 50 as illustrated in FIG. 1. And, two of the caddies 11 are overlapped with each other and are arranged on the slide sheet 10. A different component such as a bolt or a nut is housed in each of the sections separated by the partition 12 in the caddy 11. An explanatory leaflet or a guarantee card may be housed in the sections.

Figure 20:
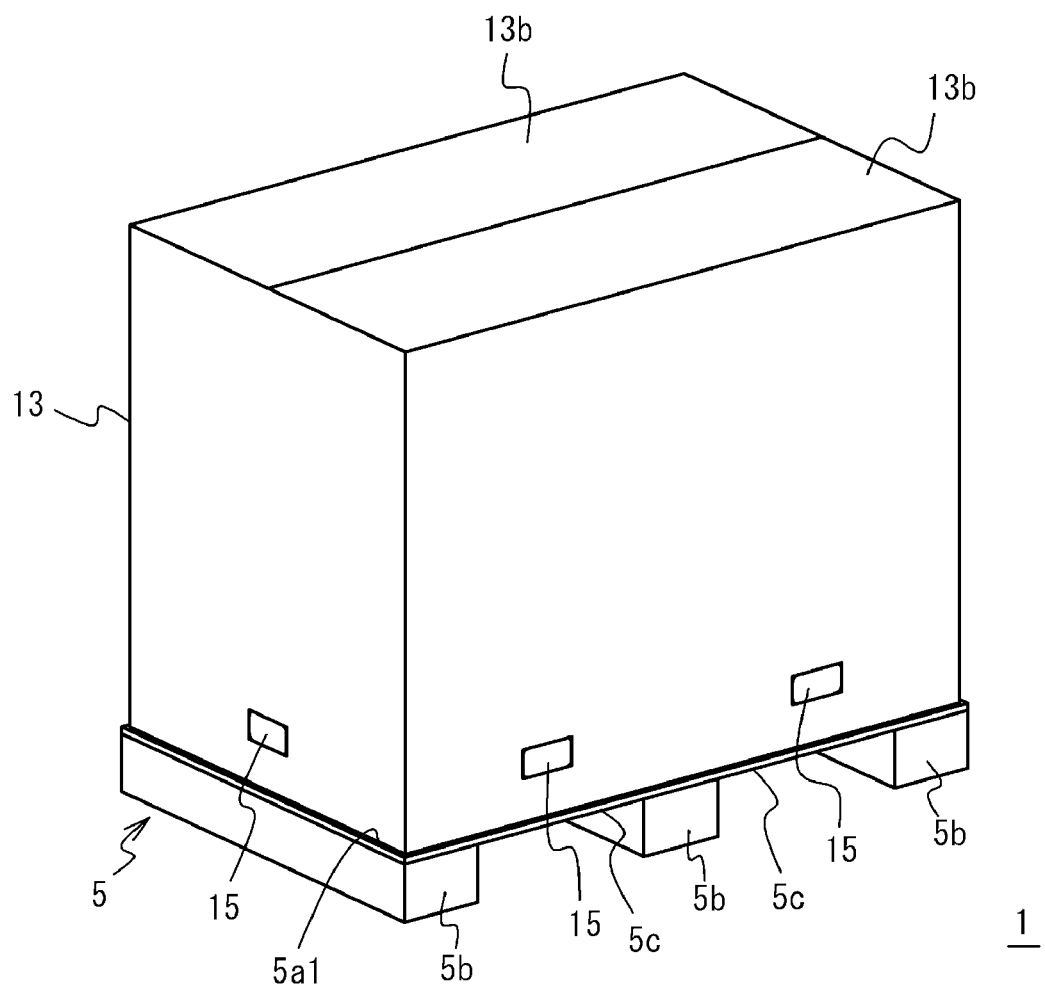
FIG. 20 illustrates a perspective view of a package of which packaging operation is finished.
Figure 21:
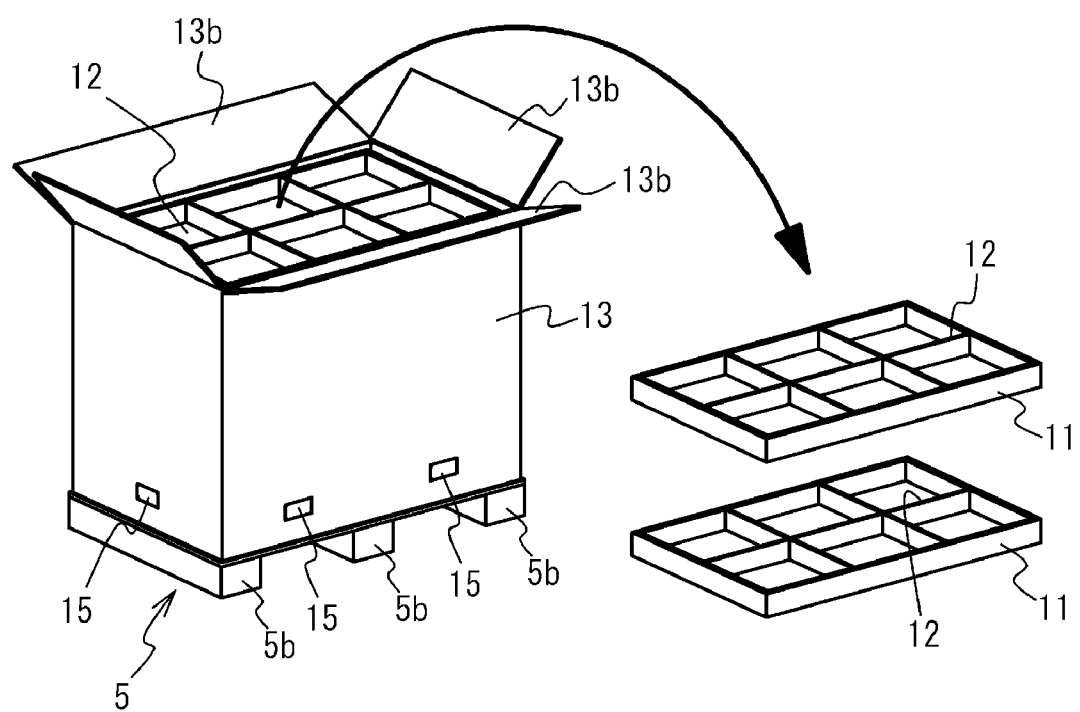
FIG. 21 illustrates an explanatory view of an aspect where a cover of a covering member of a package is opened and a caddy is extracted.

The outer covering member 13 of which cover 13*b* is closed as illustrated in FIG. 20 is fixed after the arrangement of the caddy 11. The outer covering member 13 is fixed with the bottom end edge thereof being contacting with the circumference edge portion 5*a*1. And, the joint 15 fixes the outer box 3, the inner box 4 and the outer covering member 13.

With the processes, the device 50 is packed. The device 50 packed in the package 1 is shipped in that condition, and is transported to a field for setup. The folk lift inserts the folk in the folk insert groove 5*c* and raises the package 1 when the folk lift transfers the package 1 or takes the package 1 on a truck.

Next, a description will be given of unpackaging of the package 1 at the field for setup of the device 50 and the transferring of the device 50 when the device 50 is set. Here, a description will be given of a case where the device 50 is backed with respect to a rack arranged backward of the device 50 and is transferred to the rack. The up-and-down lift 100 is alongside of the package 1 when the package 1 is unpacked. Here, a description will be given of a case where the up-and-down lift 100 is alongside on the right side of the device 50.

Figure 22:
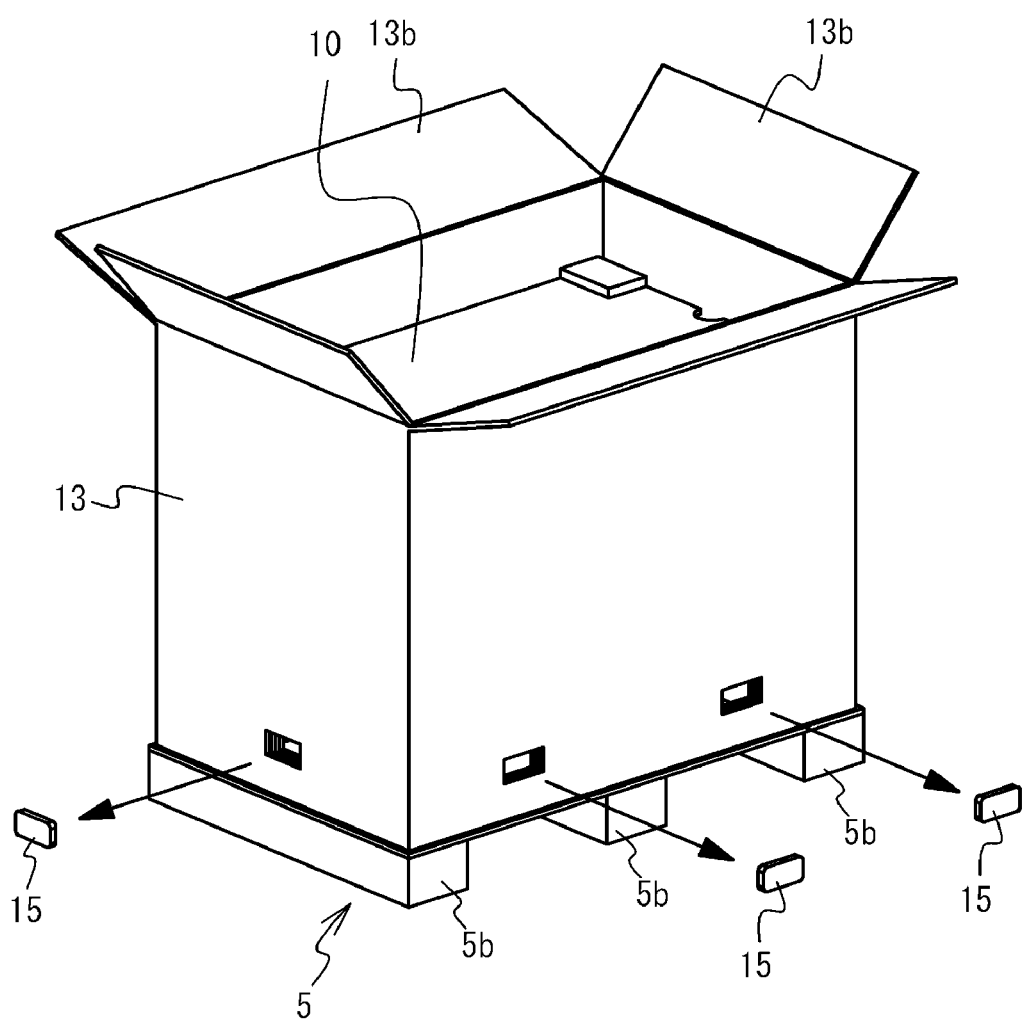
FIG. 22 illustrates an explanatory view of an aspect where a joint is extracted from an outer covering member of a package.
Figure 23:
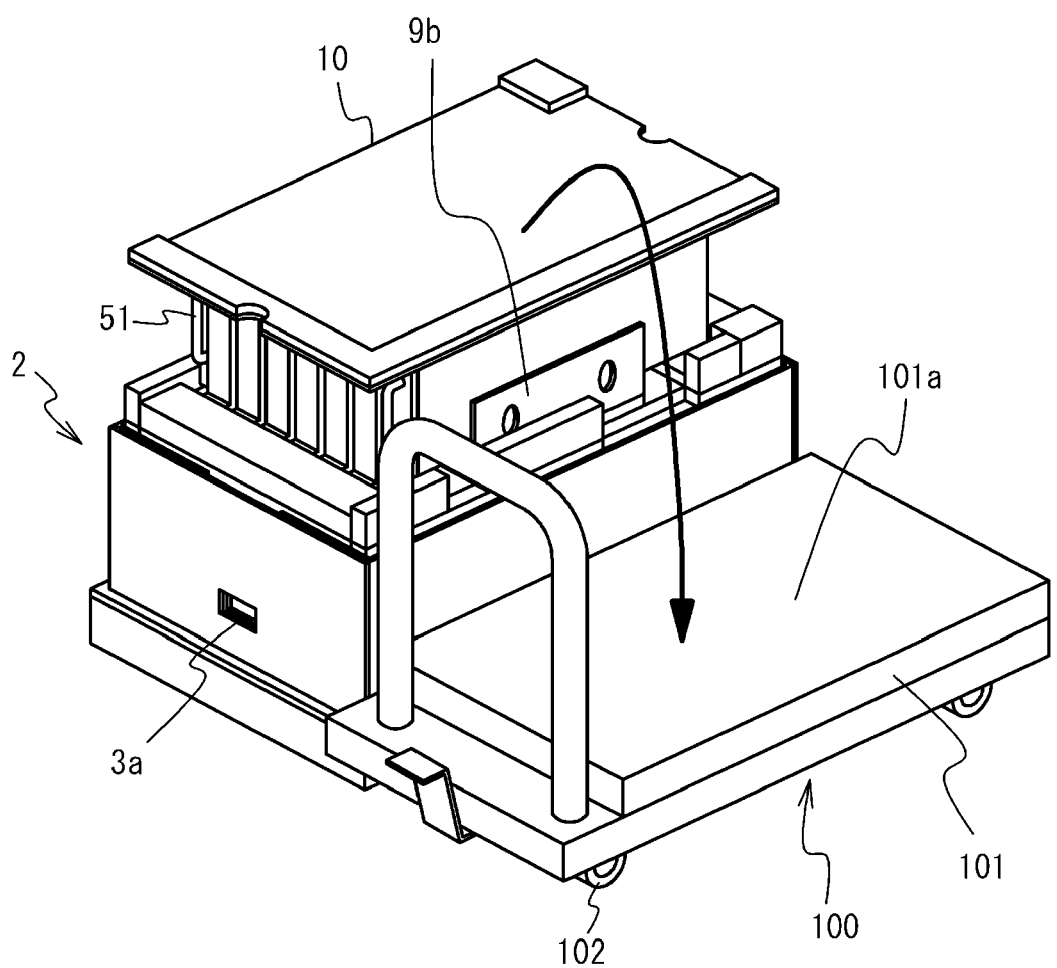
FIG. 23 illustrates an explanatory view of an operation in which a slide sheet is set on a table face.

The operator opens the cover 13*b* of the outer covering member 13 as illustrated in FIG. 13 and extracts the caddy 11. Then, the joint 15 is detached as illustrated in FIG. 22. The outer covering member 13 is raised upward and is detached. The slide sheet 10 is adhered on the table face 101*a* of the table 101 of the up-and-down lift 100 with a tape as illustrated in FIG. 23.

Figure 24:
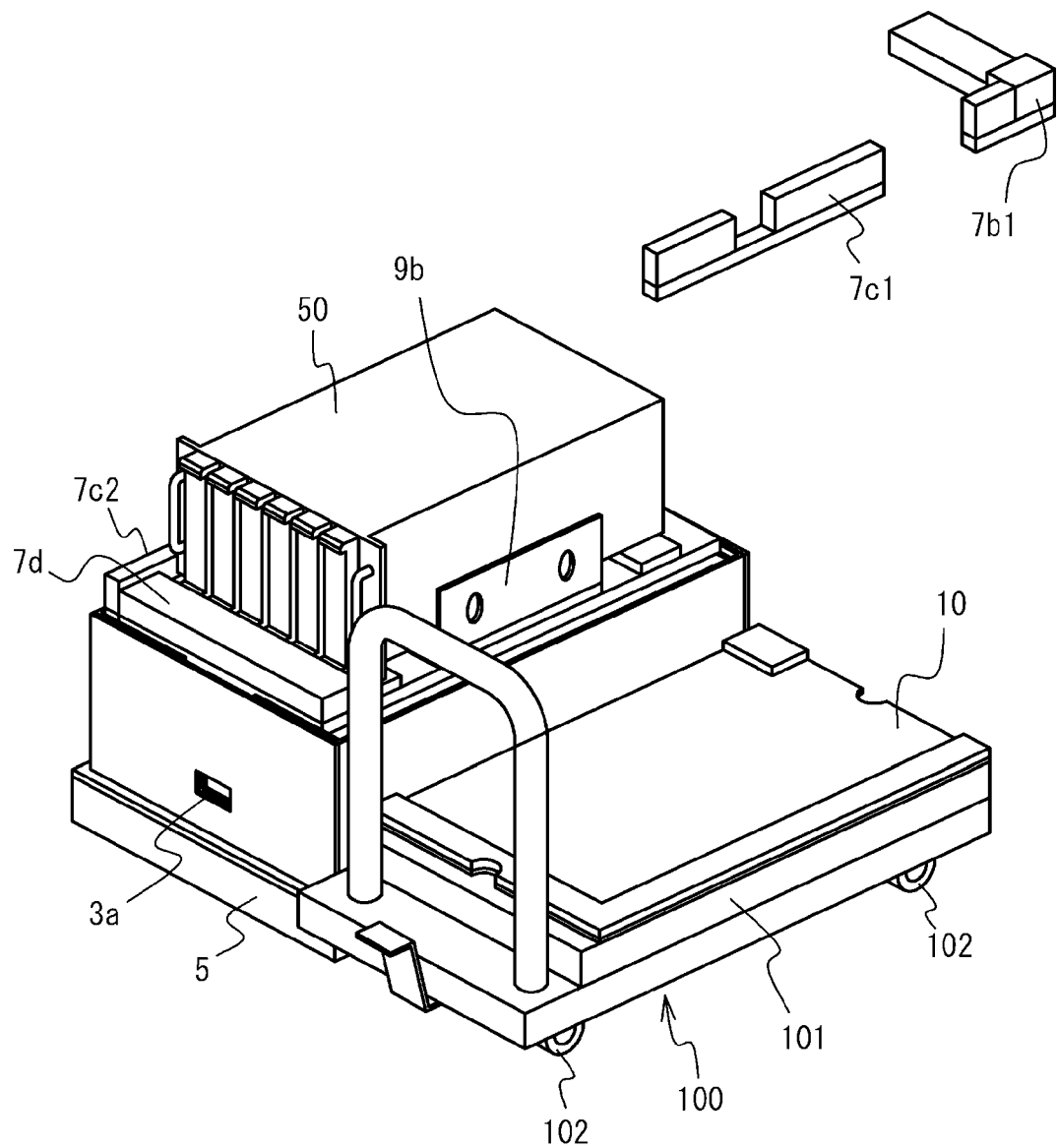
FIG. 24 illustrates an explanatory view of an operation in which a back right block and a front right block are detached.

Then, the back right block 7*b*1 and the front right block 7*c*1 on the up-and-down lift 100 side are detached as illustrated in FIG. 24. These blocks are easily detached because these blocks are not subjected to the load of the device 50.

Figure 25:
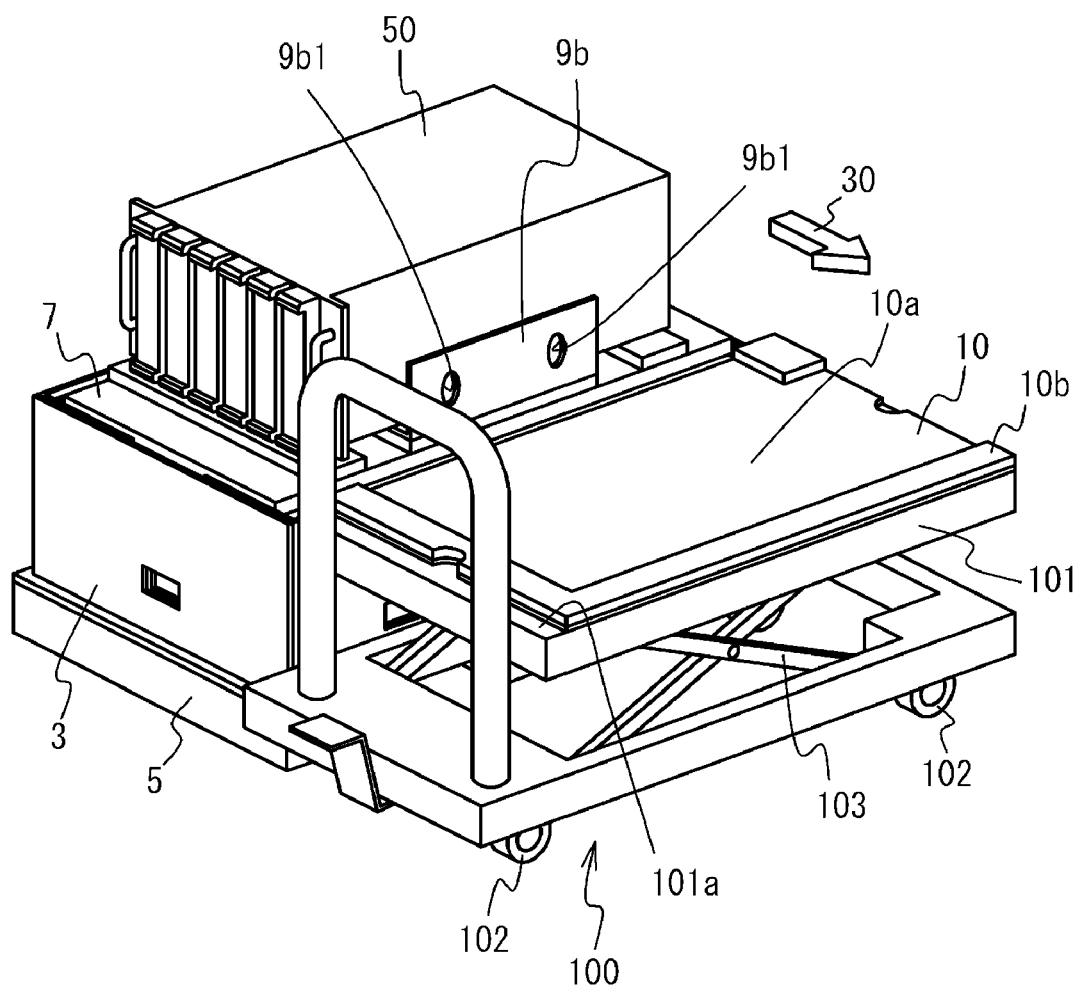
FIG. 25 illustrates a perspective view of an aspect where height of a table of an up-and-down lift is adjusted.

The operator operates the up-and-down lift 100 and adjusts the height of the table 101. At the time, the operator adjusts the height of the table face 101*a*, exactly the path 10*a* of the slide sheet 10, to be the same as that of the article mounting face 8, as illustrated in FIG. 25. The height of the table 101 may be adjusted so that the table face 101*a* is slightly lower than the article mounting face 8 within a range where the device 50 is not subjected to a shock.

With the processes, transferring preparation of the device 50 is finished when the slide sheet 10 is set, the back right block 7*b*1 and the front right block 7*c*1 are detached, and the height of the table 101 is adjusted.

Figure 26:
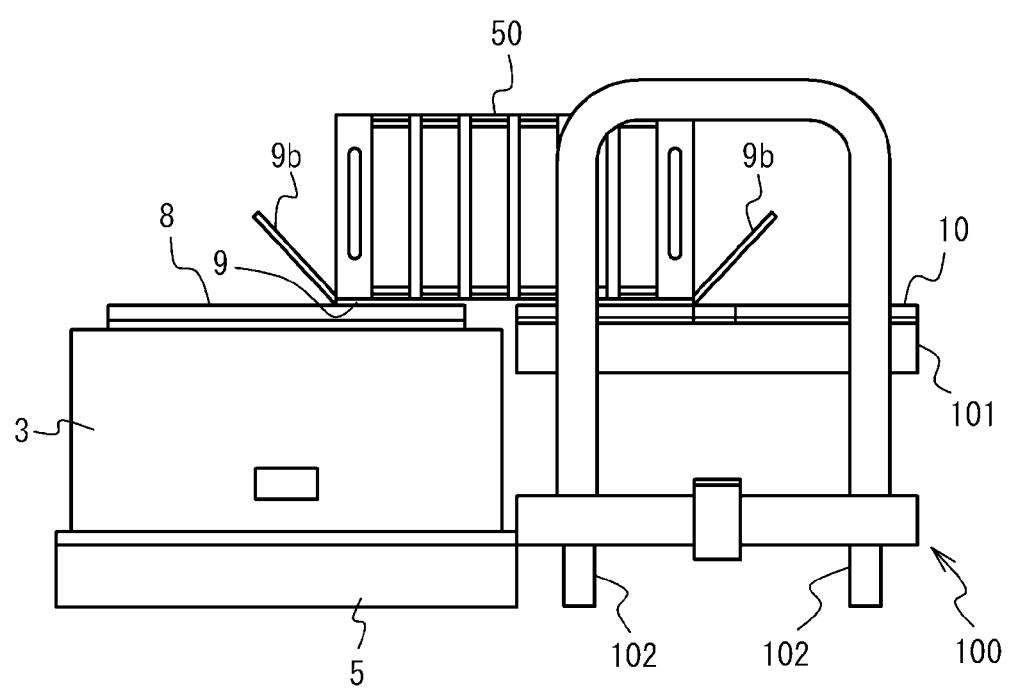
FIG. 26 illustrates an explanatory view of a sliding process of a device.

Then, the operator slides the device 50 in a direction illustrated with an arrow 30 in FIG. 25. FIG. 26 illustrates a sliding process of the device 50. At the time, the operator engages his finger in the holding hole 9*b*1, and pulls the slide tray 9 in the arrow 30 direction. Thus, the heavy device 50 is easily transferred to the table 101. At the time, the sliding of the device 50 can be stopped even if the device 50 slides fast.

Figure 27:
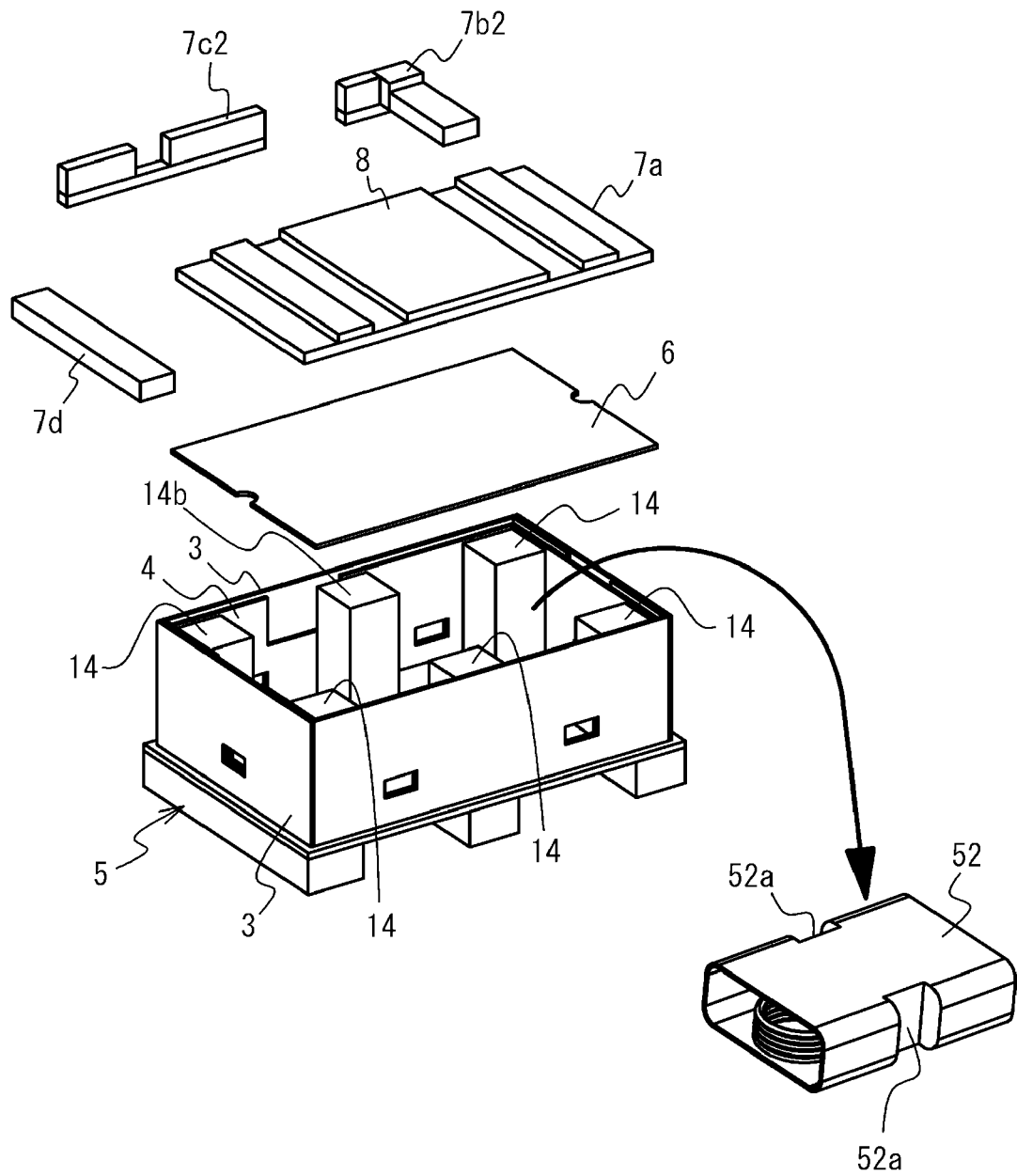
FIG. 27 illustrates an explanatory view of an operation in which a base block, a back left block, a front left block, a front face pressing block, and a top board are detached, and an accessory box is extracted.

The operator detaches the base block 7*a*, the back left block 7*b*2, the front left block 7*c*2 and the front face pressing block 7*d* as illustrated in FIG. 27 after transferring of the device 50 to the table 101. And, the operator detaches the top board 6 and extracts the accessory box 52. Then, the operator prepares a setting space of the device 50 in the rack, with use of the rail kit 53*a* housed in the accessory box 52, the bolt housed in the caddy 11, and so on.

The operator raises the table 101 to a desirable height of the rack on which the device 50 is set, after preparing the setting space of the device 50 in the rack. And, the operator slides the device 50 to the setting space. At the time, the operator engages his finger in the holding hole 9*b*1 of the slide tray 9 and slides the device 50. The operator transfers the device 50 along the rail and presses the device 50 into the rack, if the device 50 is transferred a given distance to the rail of the rack.

The device 50 is in a usable condition if the device 50 is set on the rack and the power supply cable 53*b* is connected to the device 50. That is, the electronic device 51 is already installed and is usable immediately. That is, it is not necessary to connect cables between each of the electronic devices 51 or between the electronic device 51 and the device main body 50*a*.

The device 50 set with the processes has an extremely low fault incidence caused by the connection of the cables because the device 50 is in the condition where the device 50 passes the tests at the factory.

As mentioned above, the heavy device 50 is transferred to the table 101 of the up-and-down lift 100 with the package 1. Therefore, the device 50 is set on a high position easily. The device 50 is set-up in a short time. Further, the fault incidence caused by the connection of cables is reduced.

Transportation cost and packaging material may be reduced because it is not necessary to pack the electronic device 51 separately.

The package disclosed in the above-description is summarized as follows.

A package objective article may be transferred to an up-and-down lift easily if an article mounting face on which the package objective article is to be set is positioned higher than a table face of the up-and-down lift.

The up-and-down lift brings the table up an down with an up-and-down mechanism including hydraulic mechanism or linkage mechanism. Generally, the up-and-down lift has a transferring mechanism such as a caster under the table. The table face of the up-and-down lift having the up-and-down mechanism or the transferring mechanism is positioned higher than the ground. The operator has to bring the package objective article up when transferring the package objective article on the article mounting face to the table, if the table face is higher than the bottom of the package objective article.

And so, the package disclosed in the above-mentioned description has a base portion of which article mounting face is raised so that the article mounting face is positioned higher than the table face of the up-and-down lift in a condition where the table is brought down. And, the outer covering member is detachable in a condition where the package objective article is set on the article mounting face. It is therefore possible to adjust the height of the table face by raising the table and transfer the package objective article on the article mounting face to the table easily by sliding.

That is, the package objective article is unpacked and transferred to the up-and-down lift without raising. Therefore, the package objective article may be transferred to the up-and-down lift easily even if the package objective article is heavy. And an electronic device acting as the package objective article packed with the package may be transported as a packed electronic device.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiments of the present invention have been described in detail, it should be understood that the various change, substitutions, and alterations could be made hereto without departing from the spirit and scope of the invention.

What is claimed is:

1. A package comprising:
    a base portion having an article mounting face at an upper end thereof;
    a slide tray that is provided on the article mounting face and is slidable on the article mounting face, a package objective article being mounted on the slide tray;
    an outer covering member that covers the package objective article on the slide tray and is detachable in a condition where the package objective article is set on the slide tray; and
    a slide sheet that is provided over the slide tray,
    wherein the slide sheet has a face having a path and a stopper, the slide tray being slidable on the path, the stopper preventing the slide tray from sliding on the face, the package objective article being mounted on the slide tray.

2. The package as claimed in claim 1 wherein the slide tray has a grip.

3. The package as claimed in claim 1, wherein the base portion includes a space housing an accessory of the package objective article.

4. The package as claimed in claim 1, wherein the base portion includes a column.

5. The package as claimed in claim 1, wherein:
a space housing an accessory of the package objective article is formed in the base portion; and
a plurality of columns are arranged at an interval in the base portion so as to hold the accessory.

6. The package as claimed in claim 1, wherein the base portion includes an outer box of which top face is opened and an inner box arranged in the outer box.

7. The package as claimed in claim 6, wherein a jig insert portion is formed between the outer box and the inner box.

8. The package as claimed in claim 6, wherein:
a cutting region is formed in an upper edge of a sidewall of the inner box;
the column is arranged inside of the inner box so as to be overlapped with the cutting region; and
a jig insert portion is formed between the column and the outer box.

* * * * *